(12) United States Patent
Wu et al.

(10) Patent No.: US 12,273,108 B2
(45) Date of Patent: Apr. 8, 2025

(54) APPARATUS AND METHOD FOR EXPANDING ROUND KEYS DURING DATA ENCRYPTION

(71) Applicant: Silicon Motion, Inc., Zhubei (TW)

(72) Inventors: Wun-Jhe Wu, Kinmen County (TW); Po-Hung Chen, Taoyuan (TW); Chiao-Wen Cheng, Zhubei (TW); Jiun-Hung Yu, Zhubei (TW); Chih-Wei Liu, Zhubei (TW)

(73) Assignee: SILICON MOTION, INC., Zhubei (TW)

( * ) Notice: Subject to any disclaimer, the term of this patent is extended or adjusted under 35 U.S.C. 154(b) by 207 days.

(21) Appl. No.: 18/143,313

(22) Filed: May 4, 2023

(65) Prior Publication Data

US 2024/0322828 A1 Sep. 26, 2024

(30) Foreign Application Priority Data

Mar. 20, 2023 (CN) .......................... 202310268864.0

(51) Int. Cl.
*H03K 19/177* (2020.01)
*H03K 19/173* (2006.01)
(Continued)

(52) U.S. Cl.
CPC ... *H03K 19/17768* (2013.01); *H03K 19/1737* (2013.01); *H03K 19/17728* (2013.01); *H03K 19/21* (2013.01)

(58) Field of Classification Search
CPC ......... H03K 19/1737; H03K 19/17728; H03K 19/17768; H03K 19/21
See application file for complete search history.

(56) References Cited

U.S. PATENT DOCUMENTS 7,278,085 B1 10/2007 Weng et al.
7,421,076 B2 * 9/2008 Stein .................. H04L 9/0631
380/42
(Continued)

FOREIGN PATENT DOCUMENTS

CN  107003911 A  8/2017
CN  108141358 A  6/2018
(Continued)

*Primary Examiner* — Kurtis R Bahr
(74) *Attorney, Agent, or Firm* — Birch, Stewart, Kolasch & Birch, LLP

(57) ABSTRACT

The invention introduces an apparatus and a method for expanding round keys during data encryption. The method includes: configuring a word-processing circuitry to operate in a first mode to calculate a first intermediate calculation result corresponding to an even-number round key according to a last double word of a $0^{th}$ double word to a $7^{th}$ double word in each even-number clock cycle starting from a $2^{nd}$ clock cycle; and configuring the word-processing circuitry to operate in a second mode to calculate a second intermediate calculation result corresponding to an odd-number round key according to the last double word of the $0^{th}$ double word to the $7^{th}$ double word in each odd-number clock cycle starting from a $3^{rd}$ clock cycle. In the first mode, a first data path is formed in the word-processing circuitry, which includes a word split circuitry, a rotate-word circuitry, a substitute-word circuitry, a round-constant circuitry and a word concatenation circuitry. In the second mode, a second data path is formed in the word-processing circuitry, which includes the word split circuitry, the substitute-word circuitry and the word concatenation circuitry.

20 Claims, 26 Drawing Sheets

(51) Int. Cl.
*H03K 19/17728* (2020.01)
*H03K 19/17768* (2020.01)
*H03K 19/21* (2006.01)

(56) References Cited

U.S. PATENT DOCUMENTS

| | | | |
|---|---|---|---|
| 7,653,862 B2 | 1/2010 | Hassner et al. | |
| 9,544,133 B2* | 1/2017 | Mathew | H04L 9/3073 |
| 10,404,458 B1* | 9/2019 | Yamada | H04L 9/0852 |
| 11,204,826 B2 | 12/2021 | Noguchi et al. | |
| 2006/0023875 A1* | 2/2006 | Graunke | H04L 9/065 |
| | | | 380/28 |
| 2006/0126835 A1* | 6/2006 | Kim | H04L 9/3242 |
| | | | 380/44 |
| 2006/0265563 A1 | 11/2006 | Goettfert et al. | |
| 2008/0008314 A1 | 1/2008 | Dempski et al. | |
| 2008/0240421 A1* | 10/2008 | Gopal | G06F 9/30007 |
| | | | 380/28 |
| 2014/0075265 A1 | 3/2014 | Hung et al. | |
| 2015/0244518 A1* | 8/2015 | Koo | H04L 9/0631 |
| | | | 380/44 |
| 2016/0148020 A1 | 5/2016 | Kaivani | |
| 2017/0286217 A1 | 10/2017 | Kreifels | |
| 2019/0020470 A1 | 1/2019 | Shamee et al. | |
| 2021/0049309 A1 | 2/2021 | Su | |
| 2021/0051007 A1 | 2/2021 | Li et al. | |
| 2021/0255923 A1 | 8/2021 | Kim | |
| 2023/0198754 A1* | 6/2023 | Wu | H04L 9/0861 |
| | | | 380/28 |
| 2024/0143791 A1* | 5/2024 | Wu | G06F 21/602 |

FOREIGN PATENT DOCUMENTS

| | | |
|---|---|---|
| CN | 111756541 A | 10/2020 |
| CN | 113556332 A | 10/2021 |
| TW | I500039 B | 9/2015 |
| TW | I627634 B | 6/2018 |
| TW | I673992 B | 10/2019 |
| TW | 202009776 A | 3/2020 |
| TW | 202040401 A | 11/2020 |
| TW | 202109300 A | 3/2021 |
| WO | WO 2020/199490 A1 | 10/2020 |

\* cited by examiner

|   | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 635C | 7CC8 | 7714 | 7B00 | F2A8 | 6BD0 | 6F48 | C518 | 3078 | 01E0 | 67C4 | 2B74 | FEBC | D778 | ABB0 | 76F4 |
| 1 | CA5C | 8274 | C90C | 7D28 | FA24 | 5918 | 476C | F018 | AD98 | D428 | A2DC | AF28 | 9C00 | A4F4 | 726C | C060 |
| 2 | B774 | FDEC | 9344 | 2680 | 3650 | 3F3C | F7D0 | CC74 | 34E0 | A514 | E5B0 | F1F8 | 713C | D83C | 3198 | 15A8 |
| 3 | 0498 | C7A8 | 23F8 | C330 | 185C | 963C | 0578 | 9A28 | 07C8 | 1260 | 80C4 | E278 | EB14 | 2760 | B20C | 75A4 |
| 4 | 096C | 8394 | 2CBC | 1AEC | 1B0C | 6EA8 | 5A48 | A06C | 52C4 | 3BA4 | D698 | B3EC | 29C4 | E398 | 2FEC | 845C |
| 5 | 5324 | D150 | 0000 | ED3C | 20A8 | FC0C | B15C | 5BA8 | 6A30 | CBBC | BE18 | 3914 | 4A98 | 4CB0 | 58F8 | CF24 |
| 6 | D0B0 | EF8C | AA50 | FBC4 | 43F4 | 4D50 | 3328 | 85BC | 45DC | F974 | 02B0 | 7F98 | 5074 | 3C6C | 9F50 | A8E0 |
| 7 | 5194 | A33C | 40A4 | 8F80 | 92A4 | 9DE0 | 38F4 | F560 | BCA8 | B694 | DA8C | 2148 | 10D0 | FF5C | F348 | D200 |
| 8 | CD94 | 0C14 | 1380 | ECDC | 5F30 | 97DC | 443C | 1718 | C4F8 | A7A4 | 7E78 | 3D8C | 6494 | 5D80 | 19BC | 738C |
| 9 | 600C | 8124 | 4FE0 | DCA4 | 2218 | 2A94 | 9014 | 8848 | 468C | EE6C | B830 | 1448 | DE14 | 5ED0 | 0BDC | DB6C |
| A | E0C8 | 32C8 | 3A44 | 0A3C | 49C8 | 0628 | 2430 | 5C60 | C2D0 | D3E0 | AC78 | 62BC | 91F4 | 956C | E450 | 79B0 |
| B | E700 | C8EC | 37B0 | 6DF8 | 8D30 | D5C8 | 4E00 | A900 | 6C18 | 565C | F480 | EAF4 | 6574 | 7AE0 | AEC8 | 088C |
| C | BA80 | 7850 | 25D0 | 2E0C | 1CC4 | A644 | B424 | C648 | E844 | DD44 | 7444 | 1F94 | 4B78 | BD48 | 8B18 | 8AF8 |
| D | 70DC | 3EDC | B5C4 | 6624 | 4828 | 0350 | F630 | 0EA4 | 61EC | 3500 | 57BC | B9D0 | 86EC | C180 | 1D24 | 9EB0 |
| E | E128 | F894 | 9898 | 1130 | 6960 | D9DC | 8E60 | 948C | 9BC8 | 1E74 | 870C | E9A4 | CEC4 | 550C | 2824 | DFF4 |
| F | 8CD0 | A18C | 89A8 | 0DF4 | BFF8 | E6E0 | 4214 | 6880 | 4144 | 9978 | 2D5C | 0F44 | B0BC | 54EC | BB60 | 16F8 |

|   | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 6360 | 7CC8 | 7714 | 7B3C | F294 | 6BEC | 6F48 | C518 | 3078 | 01E0 | 67C4 | 2B74 | FEBC | D778 | ABB0 | 76F4 |
| 1 | CA60 | 8274 | C930 | 7D28 | FA18 | 5924 | 476C | F024 | ADA4 | D428 | A2DC | AF14 | 9C3C | A4C8 | 7250 | C05C |
| 2 | B748 | FDEC | 9344 | 26BC | 366C | 3F00 | F7D0 | CC74 | 34DC | A528 | E5B0 | F1C4 | 7100 | D800 | 3198 | 1594 |
| 3 | 04A4 | C7A8 | 23F8 | C30C | 185C | 9600 | 0544 | 9A28 | 07F4 | 1260 | 80C4 | E244 | EB28 | 275C | B20C | 75A4 |
| 4 | 096C | 8394 | 2C80 | 1AEC | 1B0C | 6EA8 | 5A74 | A06C | 52F8 | 3BA4 | D698 | B3EC | 29C4 | E3A4 | 2FD0 | 8460 |
| 5 | 5318 | D16C | 0000 | ED3C | 20A8 | FC0C | B15C | 5B94 | 6A0C | CB80 | BE24 | 3914 | 4AA4 | 4CB0 | 58C4 | CF24 |
| 6 | D08C | EF8C | AA50 | FBF8 | 43C8 | 4D50 | 3328 | 8580 | 45DC | F948 | 02B0 | 7F98 | 5048 | 3C50 | 9F6C | A8E0 |
| 7 | 51A8 | A33C | 4098 | 8FBC | 92A4 | 9DDC | 38F4 | F560 | BC94 | B6A8 | DAB0 | 2148 | 10D0 | FF5C | F374 | D23C |
| 8 | CD94 | 0C28 | 1380 | ECDC | 5F30 | 97E0 | 443C | 1724 | C4F8 | A798 | 7E78 | 3DB0 | 6494 | 5D80 | 19BC | 73B0 |
| 9 | 6030 | 8124 | 4FE0 | DCA4 | 2218 | 2A94 | 9014 | 8848 | 468C | EE6C | B830 | 1474 | DE14 | 5ED0 | 0BDC | DB50 |
| A | E0F4 | 32C8 | 3A44 | 0A3C | 49F4 | 0614 | 240C | 5C60 | C2EC | D3DC | AC44 | 6280 | 91F4 | 9550 | E450 | 798C |
| B | E700 | C8D0 | 378C | 6DF8 | 8D0C | D5C8 | 4E00 | A900 | 6C18 | 565C | F480 | EAC8 | 6574 | 7ADC | AEF4 | 088C |
| C | BA80 | 786C | 25EC | 2E30 | 1CF8 | A678 | B418 | C648 | E878 | DD44 | 7444 | 1FA8 | 4B44 | BD74 | 8B18 | 8AF8 |
| D | 70E0 | 3EE0 | B5F8 | 6624 | 4814 | 0350 | F630 | 0E98 | 61D0 | 353C | 57BC | B9D0 | 86D0 | C1BC | 1D18 | 9E8C |
| E | E114 | F8A8 | 9898 | 1130 | 695C | D9E0 | 8E5C | 94B0 | 9BC8 | 1E48 | 8730 | E998 | CEC4 | 550C | 2824 | DFF4 |
| F | 8CEC | A18C | 89A8 | 0DC8 | BFC4 | E6E0 | 4228 | 68BC | 4178 | 9978 | 2D60 | 0F78 | B0BC | 54EC | BB60 | 16C4 |

APPARATUS AND METHOD FOR EXPANDING ROUND KEYS DURING DATA ENCRYPTION

CROSS-REFERENCE TO RELATED APPLICATIONS

This application claims the benefit of priority to Patent Application No. 2023102688640, filed in China on Mar. 20, 2023; the entirety of which is incorporated herein by reference for all purposes.

BACKGROUND

The disclosure generally relates to data encryption and, more particularly, to an apparatus and a method for expanding round keys during data encryption.

Since current storage devices (e.g. NAND flash memory) are typically used to store such as system programs, application programs, drivers, private user data, etc., data security is an important issue. Advanced Encryption Standard (AES) is a block encryption standard adopted by the U.S. federal government, and has been widely used by multiple parties. However, malicious attacks may be encountered during the operations of AES, which may cause the AES encoder to generate incorrect calculation results. Or, there are some defects in the wafer fabrication process, which makes the AES encoder produces unexpected calculation results after the AES encoder has operated for a period of time. Or, the storage device is in a harsh environment, which makes some components in the AES encoder disfunctions, resulting unexpected calculation results. The wrong encryption process would make the original user data unrecoverable, causing huge damages.

SUMMARY

In an aspect of the invention, an embodiment introduces an apparatus for expanding round keys during data encryption. The apparatus includes a register, a word-processing circuitry, and first to fourth XOR gates. The register includes components arranged operably to store eight double words. Outputs of the components for storing a $4^{th}$ double word to a $7^{th}$ double word are coupled to inputs of the components for storing a $0^{th}$ double word to a $3^{rd}$ double words, respectively. The word-processing circuitry, coupled to an output of a component for storing a last double word in the register, is arranged operably to: operate in a first mode and a second mode alternately. The word-processing circuitry calculates a first intermediate calculation result corresponding to an even-number round key according to the last double word in the first mode, and calculates a second intermediate calculation result corresponding to an odd-number round key according to the last double word in the second mode. The first XOR gates, coupled to an output of a component for storing the $0^{th}$ double word in the register and the output of the word-processing circuitry, are arranged operably to: perform a first bitwise XOR operation on the $0^{th}$ double word and the output of the word-processing circuitry; and output a first calculation result to the component for storing the $4^{th}$ double word in the register. The second XOR gates, coupled to an output of a component for storing the $1^{st}$ double word in the register and an output of the first XOR gates, are arranged operably to: perform a second bitwise XOR operation on the $1^{st}$ double word and the output of the first XOR gates; and output a second calculation result to the component for storing the $5^{th}$ double word in the register. The third XOR gates, coupled to an output of a component for storing the $2^{nd}$ double word in the register and an output of the second XOR gates, are arranged operably to: perform a third bitwise XOR operation on the $2^{nd}$ double word and the output of the second XOR gates; and output a third calculation result to the component for storing the $6^{th}$ double word in the register. The fourth XOR gates, coupled to an output of a component for storing the $3^{rd}$ double word in the register and an output of the third XOR gates, are arranged operably to: perform a fourth bitwise XOR operation on the $3^{rd}$ double word and the output of the third XOR gates; and output a fourth calculation result to the component for storing the $7^{th}$ double word in the register.

In another aspect of the invention, an embodiment introduces a method for expanding round keys during data encryption, including: configuring a word-processing circuitry to operate in a first mode to calculate a first intermediate calculation result corresponding to an even-number round key according to a last double word of a $0^{th}$ double word to a $7^{th}$ double word in each even-number clock cycle starting from a $2^{nd}$ clock cycle; and configuring the word-processing circuitry to operate in a second mode to calculate a second intermediate calculation result corresponding to an odd-number round key according to the last double word of the $0^{th}$ double word to the $7^{th}$ double word in each odd-number clock cycle starting from a $3^{rd}$ clock cycle. In the first mode, a first data path is formed in the word-processing circuitry, which includes a word split circuitry, a rotate-word circuitry, a substitute-word circuitry, a round-constant circuitry and a word concatenation circuitry. In the second mode, a second data path is formed in the word-processing circuitry, which includes the word split circuitry, the substitute-word circuitry and the word concatenation circuitry.

Both the foregoing general description and the following detailed description are examples and explanatory only, and are not restrictive of the invention as claimed.

BRIEF DESCRIPTION OF THE DRAWINGS

FIGS. 23 and 24 are schematic diagrams of 8-to-14 lookup tables according to embodiments of the invention.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
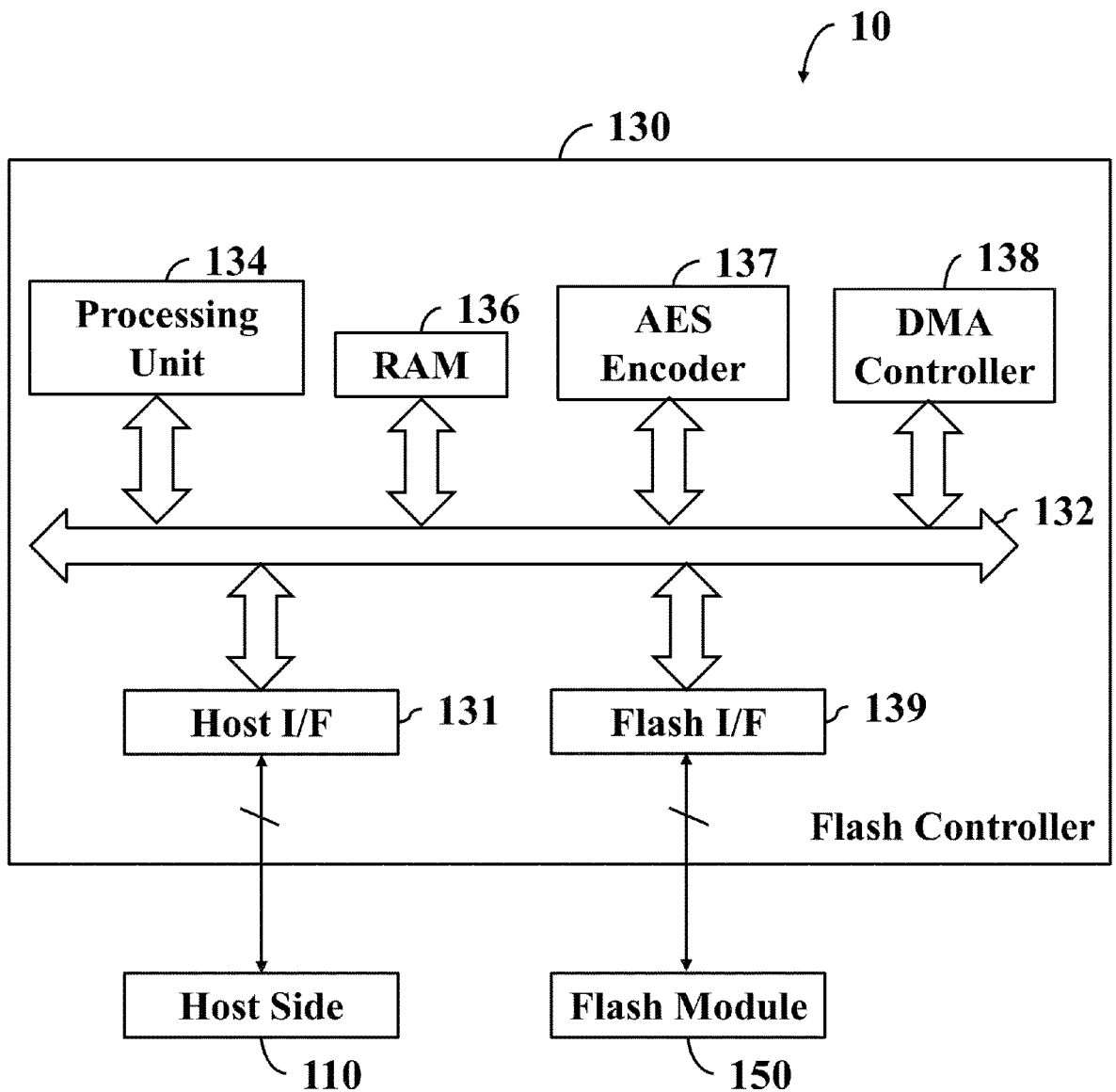
FIG. 1 is the system architecture of an electronic apparatus according to an embodiment of the invention.

Refer to FIG. 1. The electronic apparatus 10 includes a host side 110, a flash controller 130 and a flash module 150, and the flash controller 130 and the flash module 150 may be collectively referred to as a device side. The electronic apparatus 10 may be equipped with a Personal Computer (PC), a laptop PC, a tablet PC, a mobile phone, a digital camera, a digital recorder, a smart television, a smart refrigerator, a smart range hood, an automotive electronics system, or other consumer electronic products. The host side 110 and the host interface (I/F) 137 of the flash controller 130 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Embedded Multi-Media Card (eMMC) protocol, or others. The flash I/F 139 of the flash controller 130 and the flash module 150 may communicate with each other by a Double Data Rate (DDR) protocol, such as Open NAND Flash Interface (ONFI), DDR Toggle, or others. The flash controller 130 includes the processing unit 134 and the processing unit 134 may be implemented in numerous ways, such as with general-purpose hardware (e.g., a single processor, multiple processors or graphics processing units capable of parallel computations, or others) that is programmed using firmware and/or software instructions to perform the functions recited herein. The processing unit 134 may receive host commands from the host side 110 through the host I/F 131, such as read commands, write commands, erase commands, etc., schedule and execute the host commands. The flash controller 130 includes the Random Access Memory (RAM) 135, which may be implemented in a Dynamic Random Access Memory (DRAM), a Static Random Access Memory (SRAM), or the combination thereof, for allocating space as a data buffer storing user data (also referred to as host data) that has been obtained from the host side 110 and is to be programmed into the flash module 150, and that has been read from the flash module 150 and is to be output to the host side 110. The RAM 136 stores necessary data in execution, such as variables, data tables, data abstracts, host-to-flash (H2F) tables, flash-to-host (F2H) tables, or others. The flash I/F 139 includes a NAND flash controller (NFC) to provide functions that are required to access to the flash module 150, such as a command sequencer, a Low Density Parity Check (LDPC) encoder/decoder, etc.

The flash controller 130 may be equipped with the bus architecture 132 to couple components to each other to transmit data, addresses, control signals, etc. The components include but not limited to the host I/F 131, the processing unit 134, the RAM 136, the Advanced Encryption Standard (AES) encoder 137, the direct memory access (DMA) controller 138 and the flash I/F 139. The DMA controller 138 moves data between the components through the bus architecture 132 according to the instructions issued by the processing unit 134. For example, the DMA controller 138 may migrate data in a specific data buffer of the RAM 136 to specific registers in the AES encoder 137, migrate data in specific registers in the AES encoder 137 to a specific data buffer of the RAM 136, and so on.

The flash module 150 provides huge storage space typically in hundred Gigabytes (GBs), or even several Terabytes (TBs), for storing a wide range of user data, such as high-resolution images, video files, etc. The flash module 150 includes control circuits and memory arrays containing memory cells, such as being configured as Single Level Cells (SLCs), Multi-Level Cells (MLCs), Triple Level Cells (TLCs), Quad-Level Cells (QLCs), or any combinations thereof. The processing unit 134 programs user data into a designated address (a destination address) of the flash module 150 and reads user data from a designated address (a source address) thereof through the flash I/F 139. The flash I/F 139 may use several electronic signals including a data line, a clock signal line and control signal lines for coordinating the command, address and data transfer with the flash module 150. The data line may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

Figure 2:
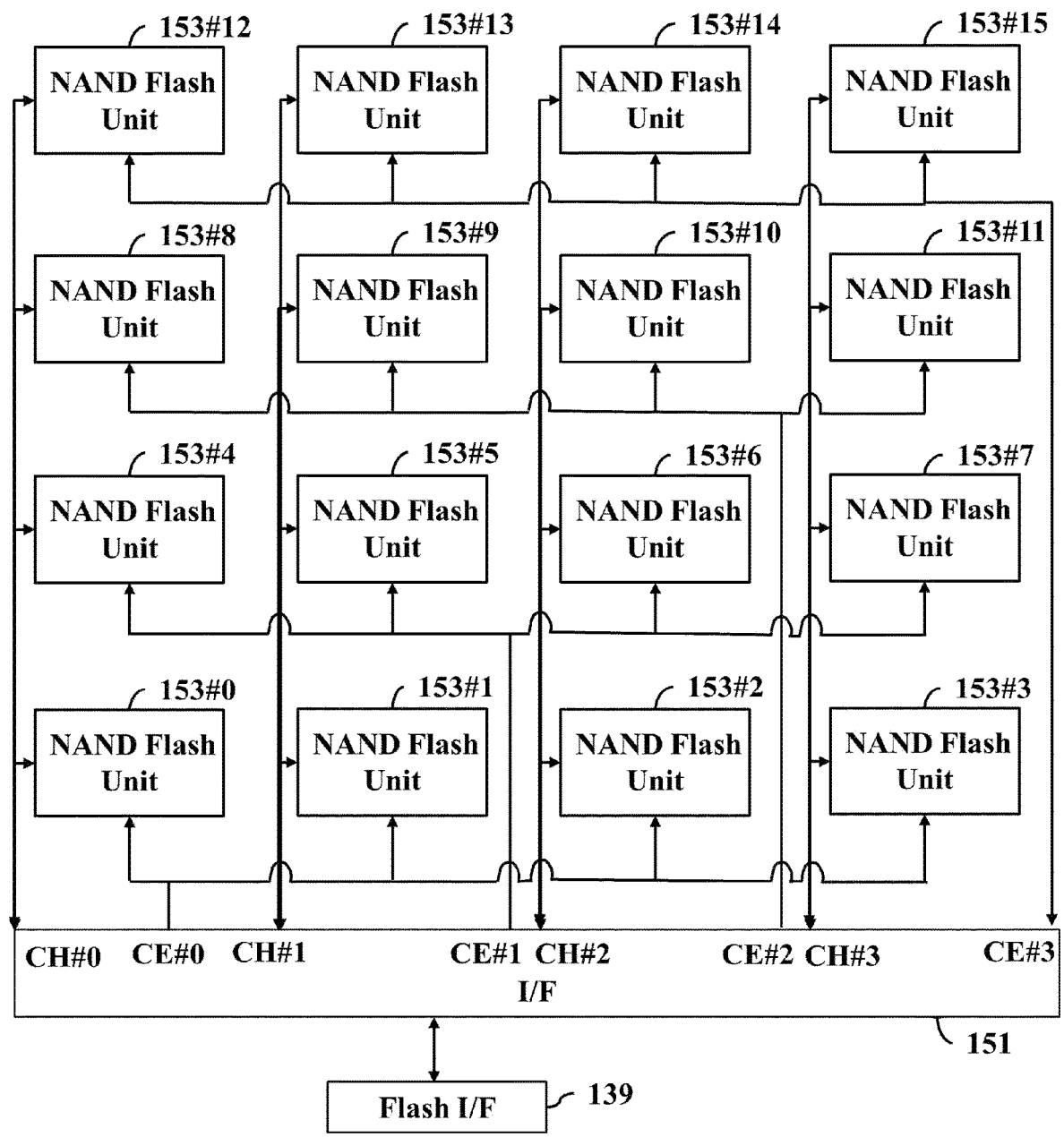
FIG. 2 is a schematic diagram illustrating a flash module according to an embodiment of the invention.

Refer to FIG. 2. The I/F 151 of the flash module 150 may include four I/O channels (hereinafter referred to as channels) CH #0 to CH #3 and each is connected to four NAND flash units, for example, the channel CH #0 is connected to the NAND flash units 150 #0, 150 #4, 150 #8 and 150 #12. Each NAND flash unit can be packaged in an independent die. The flash I/F 139 may issue one of the CE signals CE #0 to CE #3 through the I/F 151 to activate the NAND flash modules 153 #0 to 153 #3, the NAND flash modules 153 #4 to 153 #7, the NAND flash modules 153 #8 to 153 #11, or the NAND flash modules 153 #12 to 153 #15, and read data from or program data into the activated NAND flash modules in parallel.

The AES encoder 137 implements a variant algorithm of Rijndael with a fixed block size of 128 bits, and a key size of 128, 192, or 256 bits. The AES encoder 137 operates on a 4×4 column-major order array of bytes, in which each byte is referred to as a state. Most AES calculations are done in a particular finite field. For instance, 16 bytes, $S_0, S_1, \ldots, S_{15}$ are represented as the two-dimensional array:

$$\begin{bmatrix} S_0 & S_4 & S_8 & S_{12} \\ S_1 & S_5 & S_9 & S_{13} \\ S_2 & S_6 & S_{10} & S_{14} \\ S_3 & S_7 & S_{11} & S_{15} \end{bmatrix}$$

Figure 3:
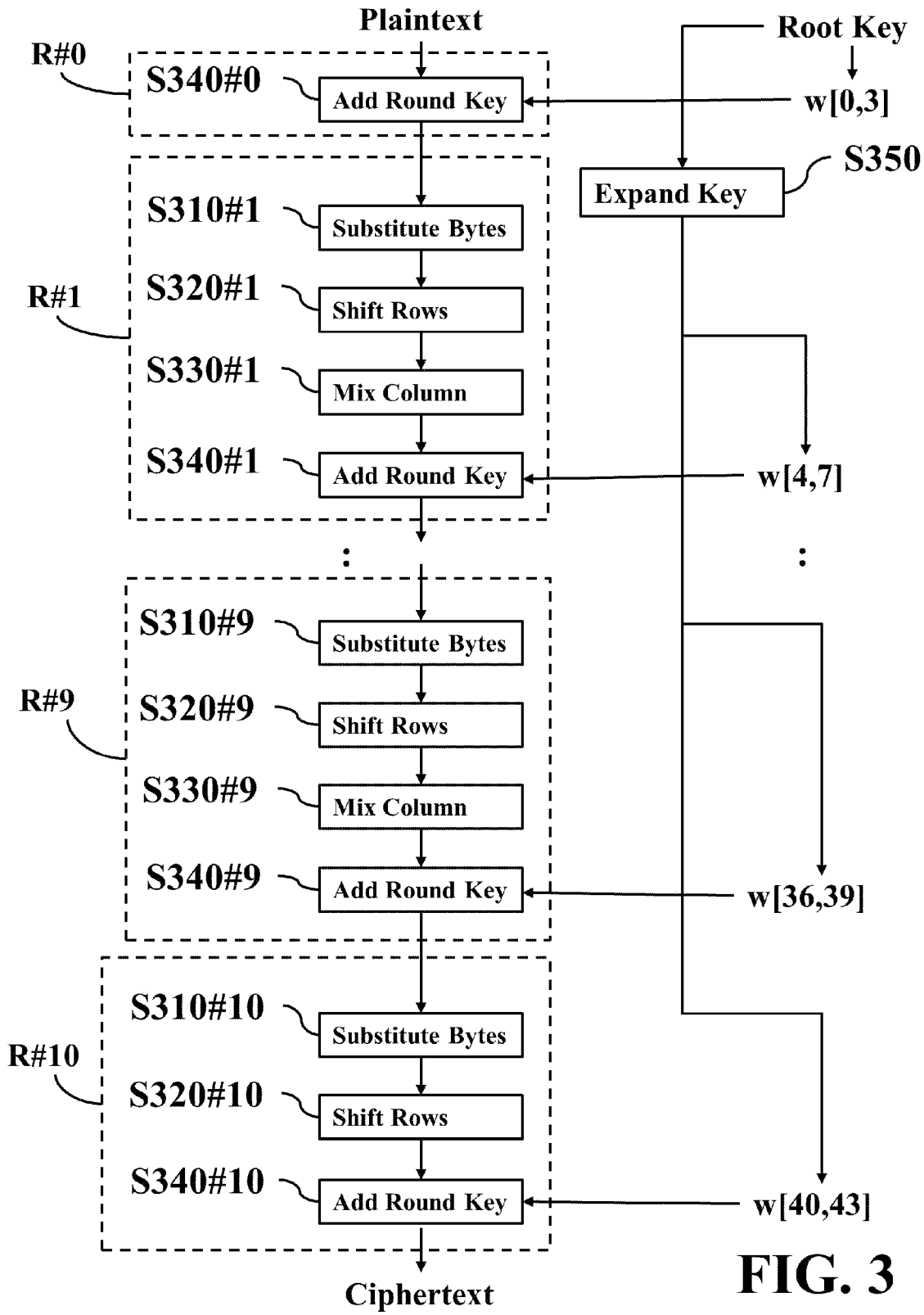
FIG. 3 is a schematic diagram showing a high-level view of the Advanced Encryption Standard (AES) encryption algorithm with 10 rounds for 128-bit key according to an embodiment of the invention.

The key size used for an AES cipher specifies the number of transformation rounds that convert the input, referred to as the plaintext, into the final output, referred to as the ciphertext. For example, 10 rounds (n=10) for 128-bit key, 12 rounds (n=12) for the 192-bit key, and 14 rounds (n=14) for 256-bit keys. Each round consists of several processing steps (or referred to as operations), including one that depends on the encryption key itself. Refer to FIG. 3 showing a schematic diagram of high-level view of the algorithm with 10 rounds for 128-bit key. The algorithm uses the step S350 (also referred to as AES key schedule) for expanding keys for different rounds based on the 128-bit root key w[0,3]. The initial round R #0 includes the step S340 #0 for adding round key (also referred to as the add-round-key operation), in which each state is combined with a respective byte of the root key w[0,3] using bitwise XOR. The subsequent 9 rounds, each of which includes the step S310 #i for substituting bytes (also referred to as the substitute-byte operation), the step S320 #i for shifting rows (also referred to as the shift-row operation), the step S330 #i for mixing columns (also referred to as the mix-column operation), and the step S340 #i for adding round key, where i is an arbitrary integer ranging from 1 to 9. The step S310 #i is a non-linear substitution step where each state is replaced with another according to a lookup table. The lookup table is established by the formula as follows:

$$SB_i = \text{Affine}((i)^{-1}), \text{ for } i = 0 \sim 127$$

$SB_i$ represents the output result of a value i, Affine( ) represents the Affine transformation function, and i is an integer ranging from 0 to 127. The step S320 #i is a transposition step where each of the last three rows is left or right shifted cyclically a certain number of steps. The step S330 #i performs a linear mixing operation which operates on the columns, combining the four states in each column. The step S340 #i adds the round key, in which each state is combined with a byte of the corresponding expanded key w[i*4,i*4+3] using bitwise XOR. The final round (i.e. the $10^{th}$ round) includes the steps S310 #10, S320 #10, and S340 #10, whose functionalities are similar with the S310 #i, S320 #i, and the S340 #i, respectively. Although FIG. 3 merely describes the algorithm with 10 rounds for 128-bit key, those artisans would understand that the technical details of the algorithms with 12 rounds for 192-bit key and 14 rounds for 256-bit key may refer to the specifications published by the National Institute of Standard and Technology (NIST).

Figure 4:
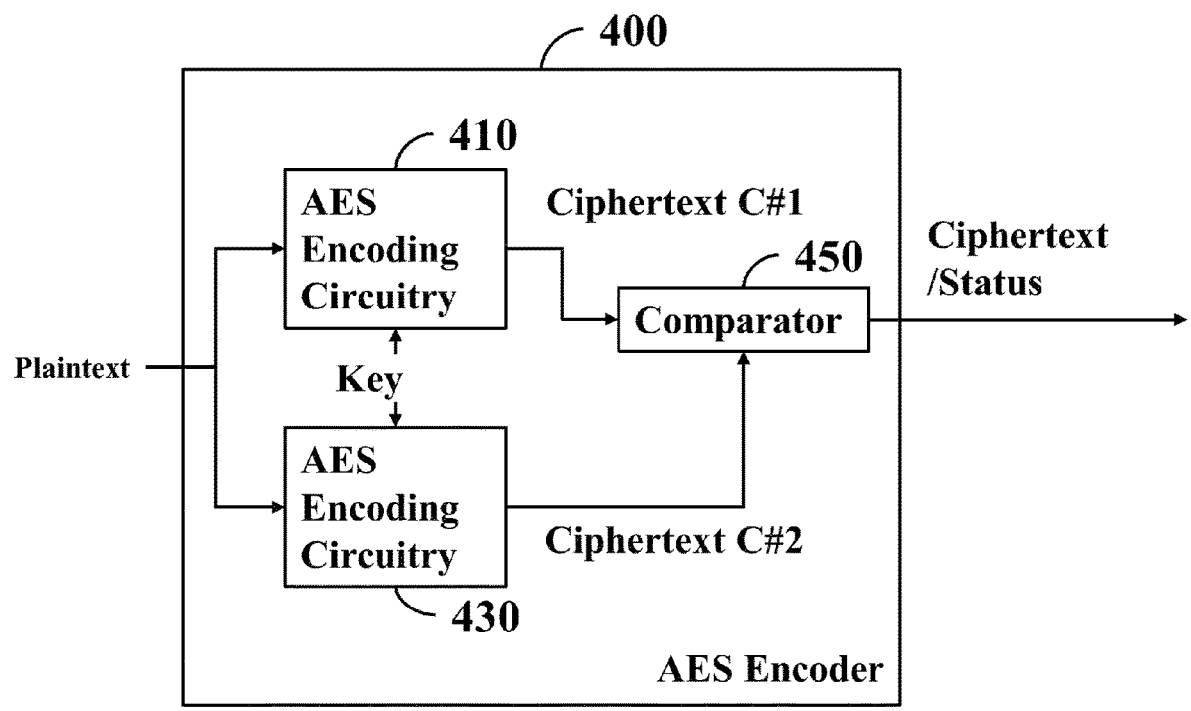
FIG. 4 is a block diagram of the AES encoder according to some implementations.

Errors would occur in the process of AES encryption when such as malicious attacks, chip defects, harsh environments, etc. are encountered, resulting in serious damage that user data cannot be recovered. Refer to FIG. 4. The AES encoder 400 of some implementations includes the AES encoding circuitries 410 and 430, which are the same for realizing the algorithm as described above. The AES encoder 400 is additionally equipped with the comparator 450, which receives the ciphertext C#1 for each state from the AES encoding circuitry 410 and the ciphertext C#2 for each state from the AES encoding circuitry 430 and compares whether the two are the same. If the ciphertext C#1 for one state is the same as the ciphertext C#2 for that state, then the comparator 450 outputs a message indicating that the encryption is successful. If the ciphertext C#1 for any state is different from the ciphertext C#2 for that state, then the comparator 450 outputs a message indicating that the encryption fails for notifying firmware running in a processing unit that an error handling procedure needs to be executed. However, the size of the AES encoder 400 as described above is larger than that of two sets of AES encoding circuitries, resulting in an increase in manufacturing cost.

Figure 5:
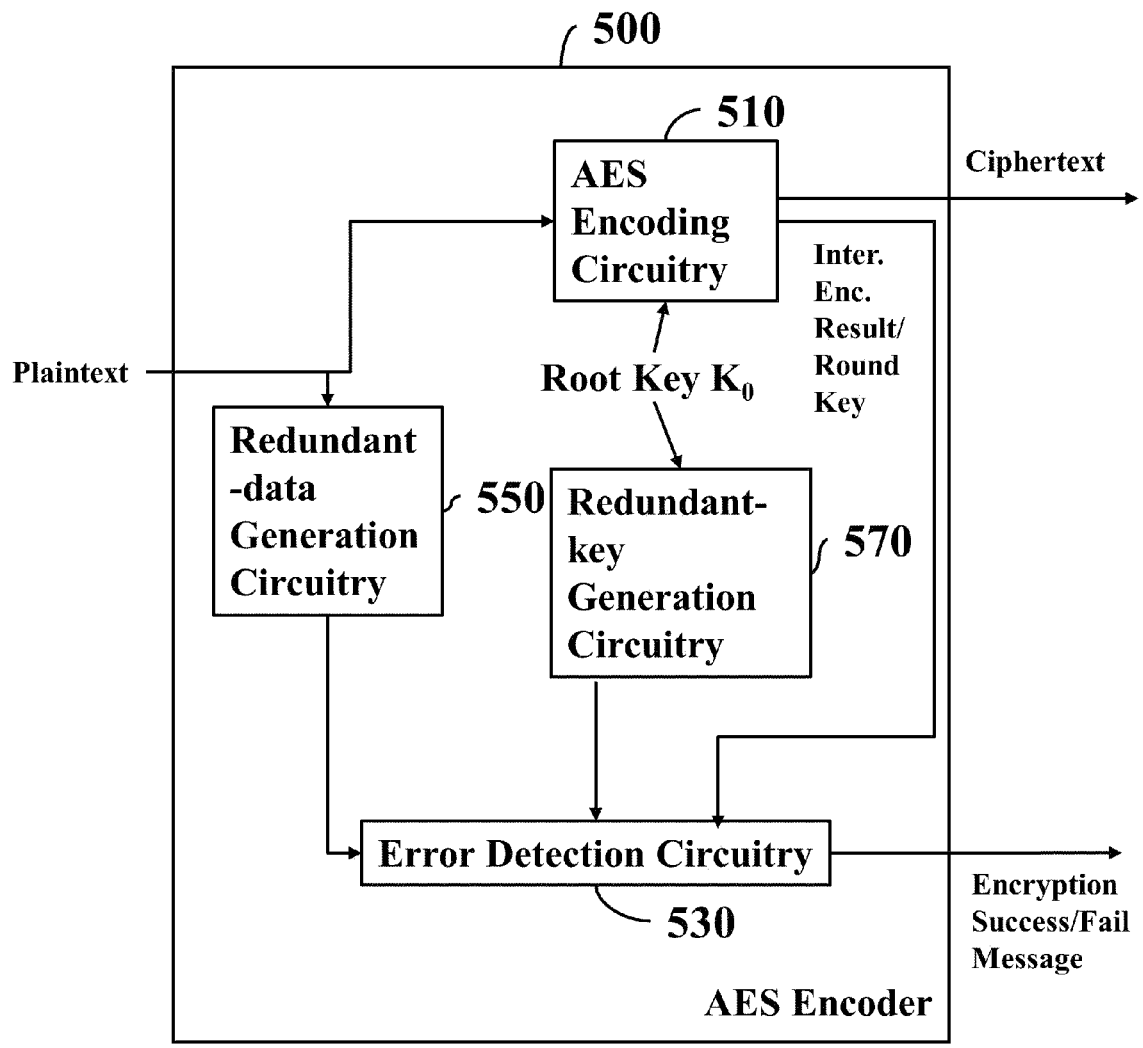
FIG. 5 is a block diagram of the AES encoder according to an embodiment of the invention.

In order to make the size of the AES encoder smaller than that of the two sets of AES encoding circuitries, from one aspect, refer to FIG. 5. An embodiment of the invention introduces that, in addition to the AES encoding circuitry for implementing the algorithm as described above, the AES encoder 500 is equipped with the error detection circuitry 530 having a smaller size than a complete set of the AES encoding circuitry 510 to detect whether any error occurs during the encryption process. The error detection circuitry 530 utilizes less information than 16 states and the related round key to determine whether any error occurred during the encryption process for each state. The error detection circuitry 530 when determining that no error has occurred outputs a message of the successful encryption. The error detection circuitry 530 when determining that any error has occurred outputs a message (or a signal) of the failed encryption to notify firmware running in a processing unit that an error handling procedure needs to be executed. For example, in the error handling procedure in response to the failed-encryption message, the firmware issues a control signal to the AES encoder 500 to restart the AES encoder 500. Then, the firmware resends the plaintext to the AES encoder 500, which has been encrypted but failed.

Figure 6:
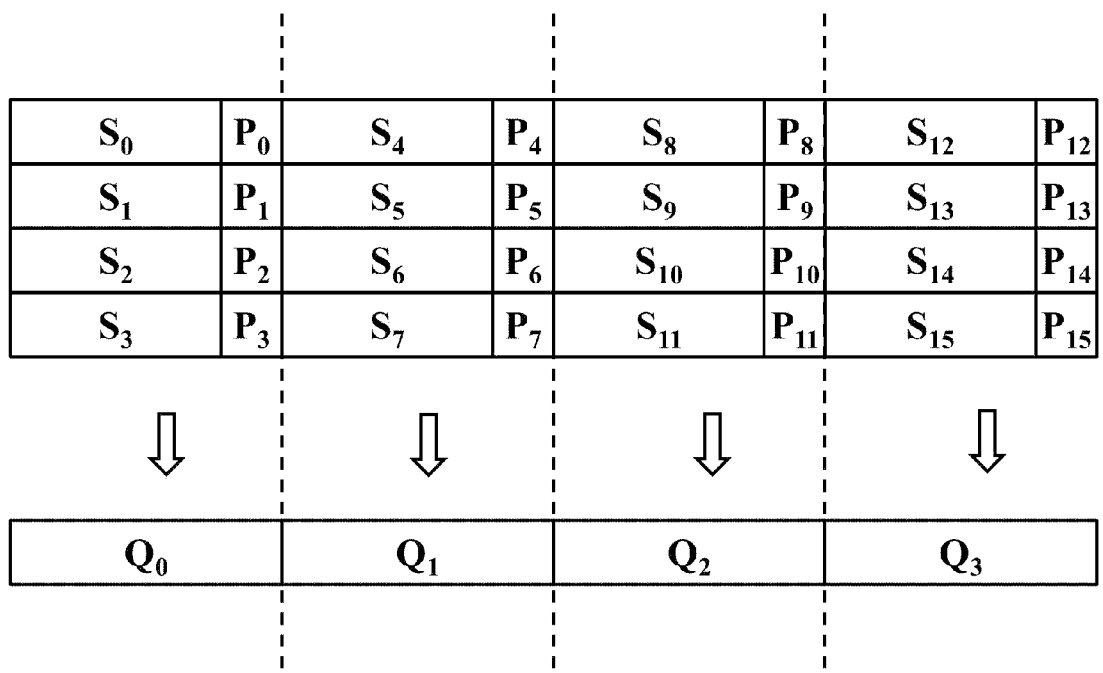
FIG. 6 is a schematic diagram illustrating states, in-state parity bits and across-state parity 9-bits according to an embodiment of the invention.

The redundant-data generation circuitry 550 adds redundant data to 16 states for allowing the error detection circuitry 530 to determine whether any error occurs in the encryption process, and the redundant data is a sort of a prediction based on values or intermediate encryption results of 16 states with a prediction algorithm, which is derived from the AES encryption algorithm. Refer to FIG. 6. In some embodiments, the redundant-data generation circuitry 550 predicts one in-state parity bit for each state and adds the in-state parity bit (as the $8^{th}$ bit) to that state (as the $0^{th}$ to $7^{th}$ bits). It is to be noted that those artisans should not interpret the aforementioned adding operation as the only way that the 8-bit state and the 1-bit in-state parity are actually stored in 9-bit continuous space, different but similar data structures are feasible. For example, the redundant-data generation circuitry 550 predicts the in-state parity bit $P_0$ for the state $S_0$, the in-state parity bit $P_1$ for the state $S_1$, and so on. The match between a state and a corresponding in-state parity bit may be expressed with the following exemplary formula:

$$P_i == \sum_{j=0}^{7} S_{i,j}$$

$P_i$ represents the value of the in-state parity bit for the $i^{th}$ state, $S_{i,j}$ represents the value of the $j^{th}$ bit of the $i^{th}$ state, and i is an integer ranging from 0 to 15. When both sides of the formula are equal, it means that the $i^{th}$ state matches the in-state parity bit for the $i^{th}$ state. Otherwise, it means that the $i^{th}$ state does not match the in-state parity bit for the $i^{th}$ state. The redundant-data generation circuitry 550 predicts one across-state parity 9-bit for state values and their in-state parity bits in each column. For example, the redundant-data generation circuitry 550 predicts the across-state parity 9-bit $Q_0$ corresponding to the state $S_0$ and its in-state parity bit $P_0$, the state $S_1$ and its in-state parity bit $P_1$, the state $S_2$ and its in-state parity bit $P_2$, the state $S_3$ and its in-state parity bit $P_3$ in the $0^{th}$ column, and so on. The match between states with their in-state parity bits in each column and a corresponding across-state parity 9-bit may be expressed with the following exemplary formulae:

$$Q_{0,j} == \sum_{i=0}^{3} S_{i,j}, \text{ for } j = 0 \sim 8$$

$$Q_{1,j} == \sum_{i=4}^{7} S_{i,j}, \text{ for } j = 0 \sim 8$$

$$Q_{2,j} == \sum_{i=8}^{11} S_{i,j}, \text{ for } j = 0 \sim 8$$

$$Q_{3,j} == \sum_{i=12}^{15} S_{i,j}, \text{ for } j = 0 \sim 8$$

$Q_{0,j}$ represents the value of the $j^{th}$ bit of the $0^{th}$ across-state parity 9-bit for the $0^{th}$ column, $Q_{1,j}$ represents the value of the $j^{th}$ bit of the $1^{st}$ across-state parity 9-bit for the $1^{st}$ column, $Q_{2,j}$ represents the value of the $j^h$ bit of the $2^{nd}$ across-state parity 9-bit for the $2^{nd}$ column, $Q_{3,j}$ represents the value of the $j^{th}$ bit of the $3^{rd}$ across-state parity 9-bit for the $3^{rd}$ column, $S_{i,j}$ represents the value of the $j^{th}$ bit of the $i^{th}$ state, and j is an integer ranging from 0 to 8. When each bit of the $i^{th}$ across-state parity 9-bit is equal to the summation (or the XORed result) of the corresponding state bits or the corresponding in-state parity bits in the $i^{th}$ column, it means that the states with their in-state parity bits in the $i^{th}$ column match the $i^{th}$ across-state parity 9-bit. Otherwise, it means that the states with their in-state parity bits in the $i^{th}$ column do not match the $i^{th}$ across-state parity 9-bit.

In one aspect, the AES encoding circuitry 510 and the redundant-data generation circuitry 550 operate independently and in parallel, and no data and message exchange is performed between the two circuitries. The redundant-data generation circuitry 550 uses a redundant-data update algorithm to generate predicted redundant data, and the redundant-data update algorithm is derived from the AES encryption algorithm, so that the intermediate encryption results generated without any error by the AES encoding circuitry 510 maintains the specific mathematical relationship with the redundant data predicted by the redundant-data generation circuitry 550 at each specific time point during the process for encrypting the plaintext.

Figure 7:
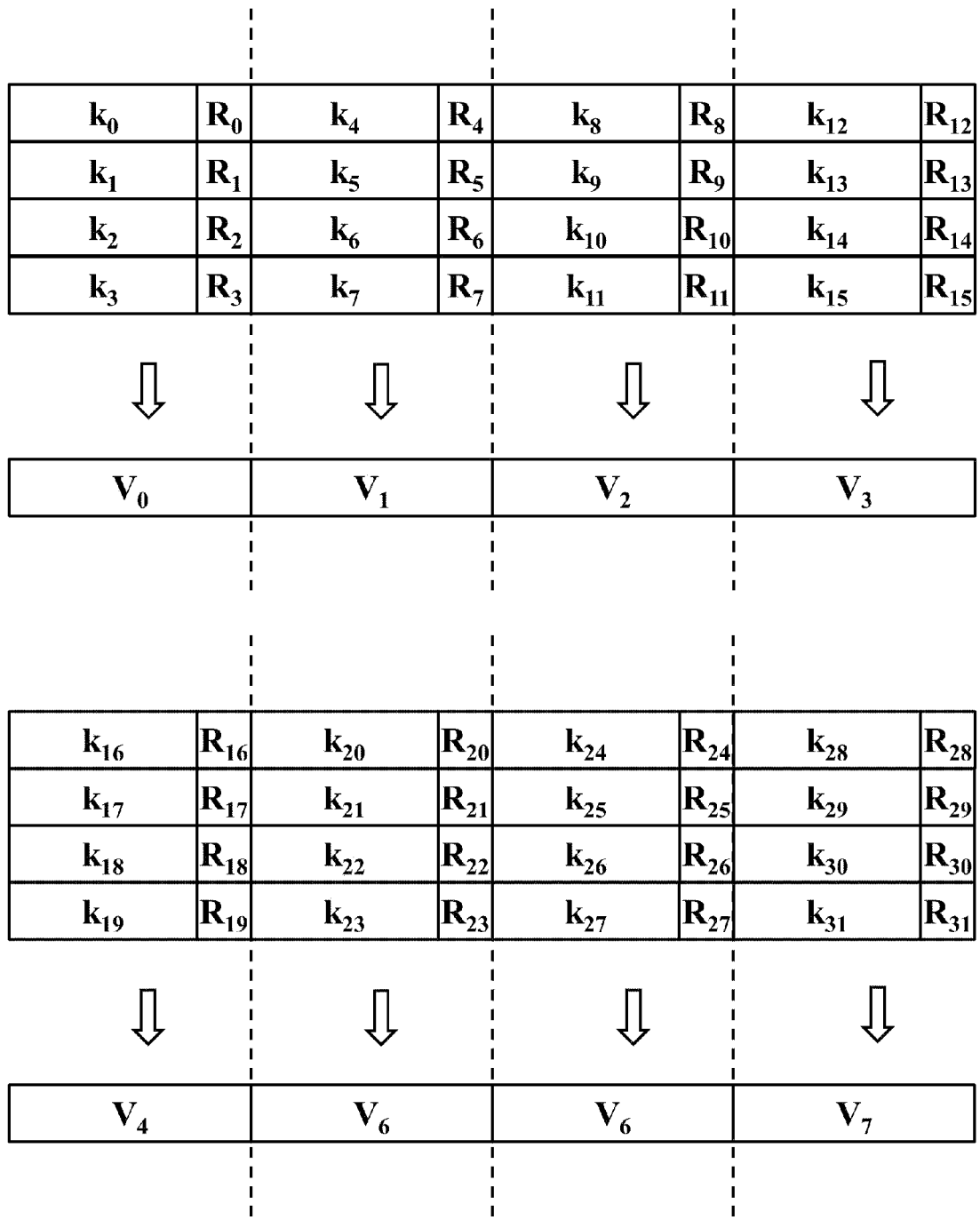
FIG. 7 is a schematic diagram illustrating subkeys, in-subkey parity bits and across-subkey parity 9-bits according to an embodiment of the invention.

The redundant-key generation circuitry 570 adds redundant data to the root key or each round key for allowing the error detection circuitry 530 to determine whether any error occurs in the key generation process, and the redundant data is a sort of a prediction based on a value of the root key or the round key with a prediction algorithm, which is derived from the AES key expansion algorithm. Refer to FIG. 7. Taking the 256-bit root key as an example, the redundant-key generation circuitry 570 divides the root key into 32 bytes in sequence—in which each byte may be referred to as a subkey, and organizes the divided bytes in an array with 8 rows and 4 columns. The redundant-key generation circuitry 570 predicts one in-subkey parity bit for each subkey and adds the in-subkey parity bit (as the $8^{th}$ bit) to that subkey (as the $0^{th}$ to $7^{th}$ bits). It is to be noted that those artisans should not interpret the aforementioned adding operation as the only way that the 8-bit subkey and the 1-bit in-subkey parity are actually stored in 9-bit continuous space, different but similar data structures are feasible. For example, the redundant-key generation circuitry 570 predicts the in-subkey parity bit $R_0$ for the subkey $k_0$, the in-subkey parity bit $R_1$ for the subkey $k_1$, and so on. The match between a subkey and a corresponding in-subkey parity bit may be expressed with the following exemplary formula:

$$R_i == \sum_{j=0}^{7} k_{i,j}$$

$R_i$ represents the value of the in-subkey parity bit for the $i^{th}$ subkey, $k_{i,j}$ represents the value of the $j^{th}$ bit of the $i^{th}$ subkey, and i is an integer ranging from 0 to 15. When both sides of the formula are equal, it means that the $i^{th}$ subkey matches the in-subkey parity bit for the $i^{th}$ subkey. Otherwise, it means that the $i^{th}$ subkey does not match the in-subkey parity bit for the $i^{th}$ subkey. The redundant-key generation circuitry 570 predicts one across-subkey parity 9-bit for subkey values and their in-subkey parity bits in each column. For example, the redundant-key generation circuitry 570 predicts the across-subkey parity 9-bit $V_0$ corresponding to the subkey $k_0$ and its in-subkey parity bit $R_0$, the subkey $k_1$ and its in-subkey parity bit $R_1$, the subkey $k_2$ and its in-subkey parity bit $R_2$, the subkey $k_3$ and its in-subkey parity bit $R_3$ in the $0^{th}$ column, and so on. The match between subkeys with their in-subkey parity bits in each column and a corresponding across-subkey parity 9-bit may be expressed with the following exemplary formulae:

$$V_{0,j} == \sum_{i=0}^{3} k_{i,j}, \text{ for } j = 0 \sim 8$$

-continued $$V_{1,j} == \sum_{i=4}^{7} k_{i,j}, \text{for } j = 0 \sim 8$$

$$V_{2,j} == \sum_{i=8}^{11} k_{i,j}, \text{for } j = 0 \sim 8$$

$$V_{3,j} == \sum_{i=12}^{15} k_{i,j}, \text{for } j = 0 \sim 8$$

$$V_{4,j} == \sum_{i=16}^{19} k_{i,j}, \text{for } j = 0 \sim 8$$

$$V_{5,j} == \sum_{i=20}^{23} k_{i,j}, \text{for } j = 0 \sim 8$$

$$V_{6,j} == \sum_{i=24}^{27} k_{i,j}, \text{for } j = 0 \sim 8$$

$$V_{7,j} == \sum_{i=28}^{31} k_{i,j}, \text{for } j = 0 \sim 8$$

$V_{0,j}$ represents the value of the $j^{th}$ bit of the $0^{th}$ across-subkey parity 9-bit for the $0^{th}$ column, $V_{1,j}$ represents the value of the $j^{th}$ bit of the $1^{st}$ across-subkey parity 9-bit for the $1^{st}$ column, $V_{2,j}$ represents the value of the $j^{th}$ bit of the $2^{nd}$ across-subkey parity 9-bit for the $2^{nd}$ column, $V_{3,j}$ represents the value of the $j^{th}$ bit of the $3^{rd}$ across-subkey parity 9-bit for the $3^{rd}$ column, $V_{4,j}$ represents the value of the $j^{th}$ bit of the $4^{th}$ across-subkey parity 9-bit for the $4^{th}$ column, $V_{5,j}$ represents the value of the $j^{th}$ bit of the $5^{th}$ across-subkey parity 9-bit for the $5^{th}$ column, $V_{6,j}$ represents the value of the $j^{th}$ bit of the $6^{th}$ across-subkey parity 9-bit for the $6^{th}$ column, $V_{7,j}$ represents the value of the $j^{th}$ bit of the $7^{th}$ across-subkey parity 9-bit for the $7^{th}$ column, $k_{i,j}$ represents the value of the $j^{th}$ bit of the $i^{th}$ subkey, and j is an integer ranging from 0 to 8. When each bit of the $i^{th}$ across-subkey parity 9-bit is equal to the summation (or the XORed result) of the corresponding subkey bits or the corresponding in-subkey parity bits in the $i^{th}$ column, it means that the subkeys with their in-subkey parity bits in the $i^{th}$ column match the $i^{th}$ across-subkey parity 9-bit. Otherwise, it means that the states with their in-subkey parity bits in the $i^{th}$ column do not match the $i^{th}$ across-subkey parity 9-bit.

In one aspect, the AES encoding circuitry 510 and the redundant-key generation circuitry 570 operate independently and in parallel, and no data and message exchange is performed between the two circuitries. The redundant-key generation circuitry 570 uses a redundant-key update algorithm to generate predicted redundant data, and the redundant-key update algorithm is derived from the AES key schedule in the AES encryption algorithm, so that the round key generated without any error by the AES encoding circuitry 510 maintains the specific mathematical relationship with the redundant data predicted by the redundant-key generation circuitry 570 at each specific time point during the process for generating the round keys.

Although FIG. 5 shows the AES encoding circuitry 510, the error detection circuitry 530, the redundant-data generation circuitry 550 and redundant-key generation circuitry 570 in different blocks, this is only to make the audience easy to understand. Those artisans may realize that the AES encoding circuitry 510, the error detection circuitry 530, the redundant-data generation circuitry 550 and redundant-key generation circuitry 570 are integrated together in an appropriate manner and the invention is not limited thereto.

Figure 8:
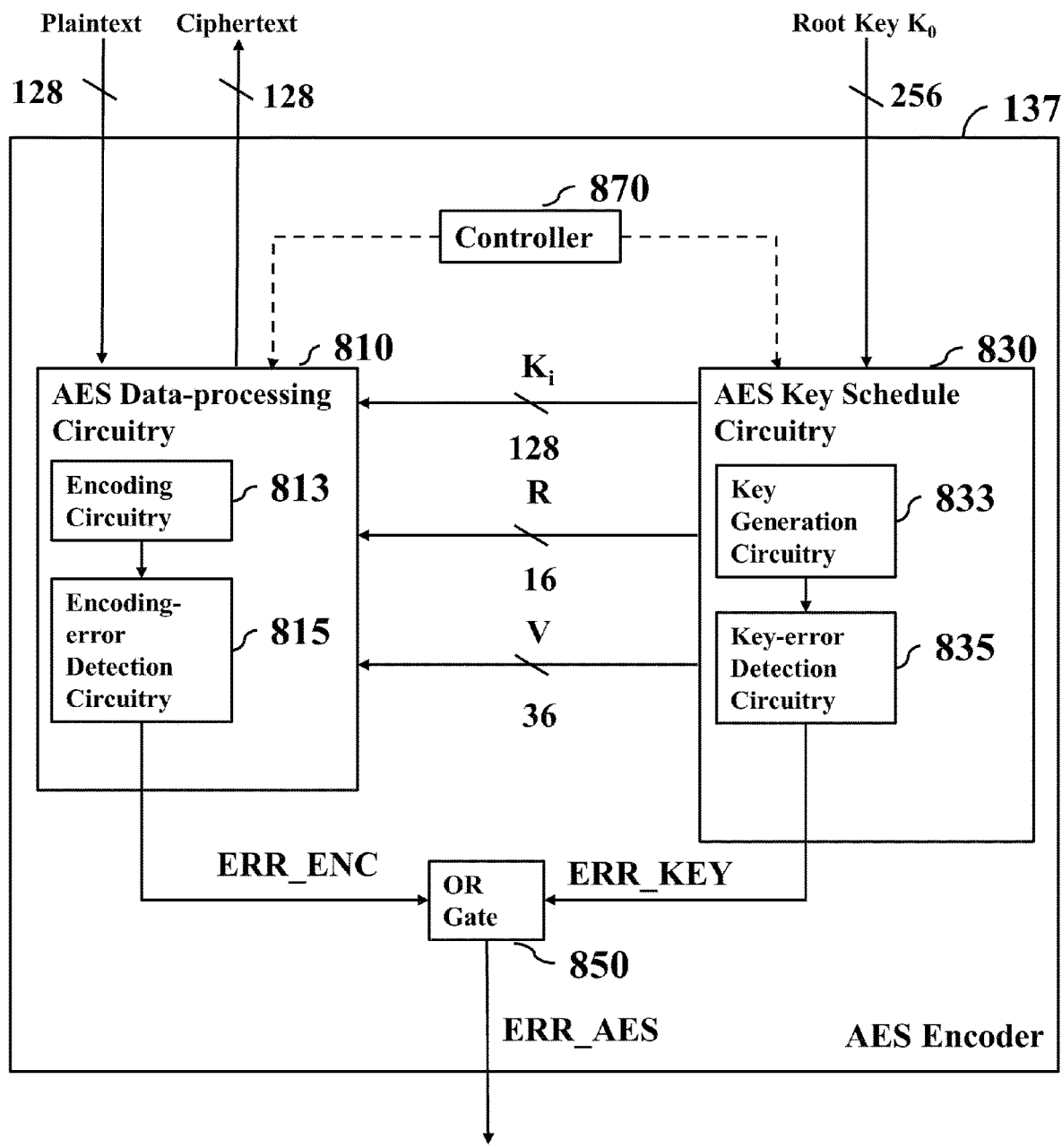
FIG. 8 is a block diagram of the AES encoder according to an embodiment of the invention.

In another aspect, refer to FIG. 8. An embodiment of the invention introduces that the AES encoder 137 is equipped with the AES data processing circuitry 810 and the AES key schedule circuitry 830. The AES key schedule circuitry 830 includes the key generation circuitry for realizing the step S350 as shown in FIG. 3 for expanding key. The controller 870 issues a control signal to the AES key schedule circuitry 830 to drive the AES key schedule circuitry 830 for generating a new round key based on the root key $K_0$ or the previous round key $K_{i-2}$ and outputting the round key Ki and corresponding redundant data (such as the in-subkey parity bits R and the across-subkey parity 9-bits V) in the designated round to the AES data processing circuitry 810. The AES key schedule circuitry 830 includes the key-error detection circuitry 835, which is arranged operably to calculate the redundant data corresponding to each round key and output the error signal ERR_KEY=1 when finding that any round key does not match the corresponding redundant data at a specific time point during the key expansion process. The round key is divided into 16 subkeys and the subkeys are organized in an array of 4×4 bytes, where each subkey is one byte. The redundant data includes one in-subkey parity bit corresponding to each subkey, and one across-subkey parity 9-bit corresponding to each column. The key-error detection circuitry 835 outputs the error signal ERR_KEY=1 when finding that any subkey does not match the corresponding in-subkey parity bit, or the subkeys with the corresponding in-subkey parity bits in any column does not match the corresponding across-subkey 9-bit.

The AES data-processing circuitry 810 includes the encoding circuitry 813, which is arranged operably to realize steps S310 for substituting bytes, S320 for shifting rows, S330 for mixing columns and S340 for adding round key in the AES algorithm as shown in FIG. 3. The AES algorithm includes multiple rounds, in which of each round encodes the plaintext or the intermediate encryption result with a round key. The controller 870 issues a control signal to the AES data-processing circuitry 810 for driving the AES data-processing circuitry 810 to arrange the execution sequence of the above steps to conform to the round setting of the AES algorithm. The AES data-processing circuitry 810 includes the encoding-error detection circuitry 815, which is arranged operably to calculate redundant data corresponding to the plaintext or the intermediate encryption results and output the error signal ERR_ENC=1 when finding that any intermediate encryption result does not match the corresponding redundant data at a specific check point during the encryption process. The plaintext or the intermediate encryption results is divided into 16 states and the states are organized in an array of 4×4 bytes, where each state is one byte. The redundant data includes one in-state parity bit corresponding to each state, and one across-state parity 9-bit corresponding to each column. The encoding-error detection circuitry 815 outputs the error signal ERR_ENC=1 when finding that the intermediate encryption result for any state does not match a corresponding in-state parity bit, or the intermediate encryption result in any column with four corresponding in-state parity bits does not match a corresponding across-state parity 9-bit.

The OR gate 850 is coupled to the output terminals of the encoding-error detection circuitry 815 and the key-error detection circuitry 835. The OR gate 850 outputs the error signal ERR_AES=1 to the processing unit 134 when the encoding-error detection circuitry 815 outputs the encoding error signal ERR_ENC=1 and/or the key-error detection circuitry 835 outputs the key error signal ERR_KEY=1.

Figure 9:
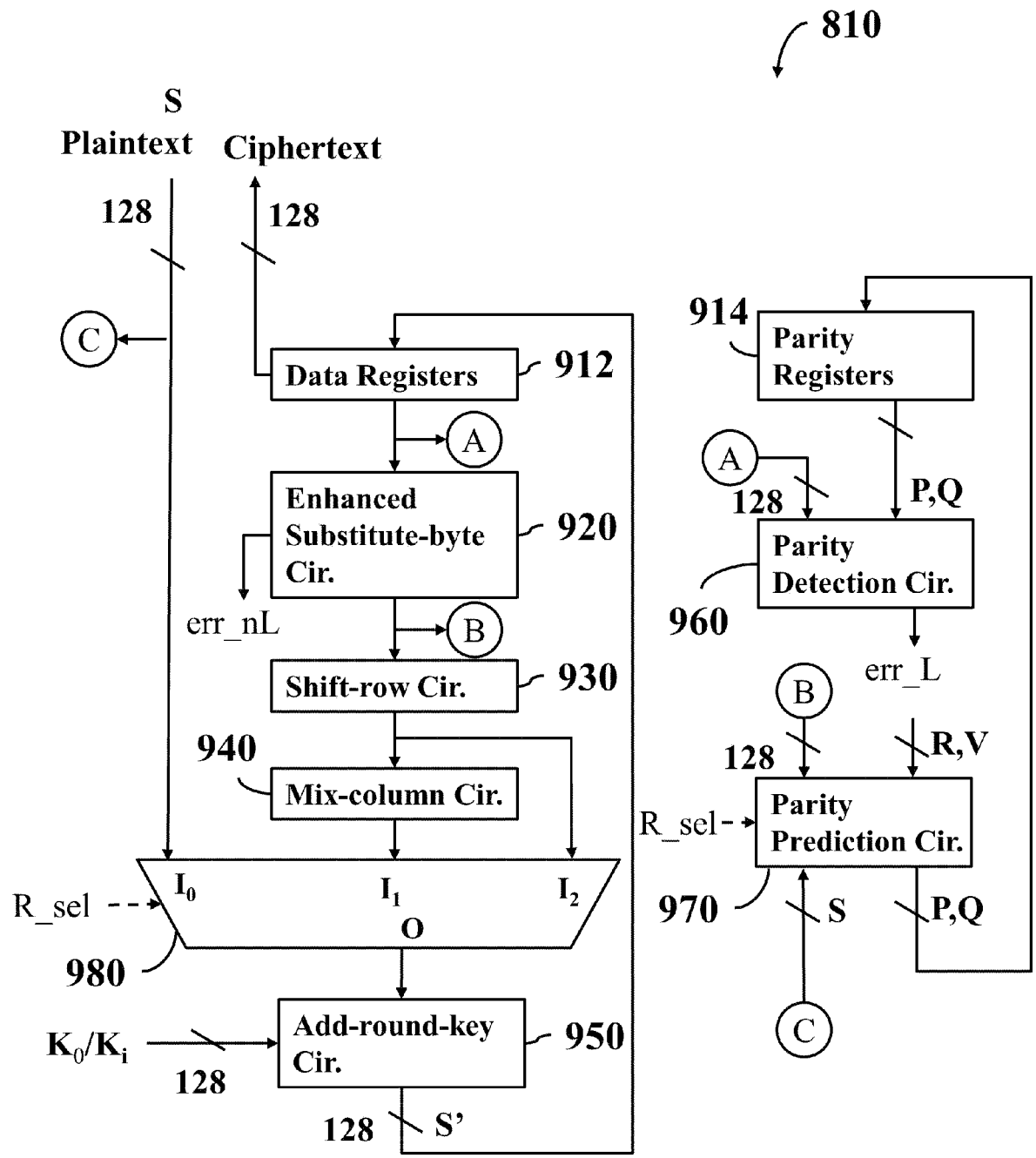
FIG. 9 is a block diagram of the AES data-processing circuitry according to an embodiment of the invention.

Refer to FIG. 9 showing the block diagram of the AES data-processing circuitry 810. The data registers 912 stores the intermediate or the final results of 16 bytes (i.e., 128 bits) and the parity registers 914 stores in-state parity bits and across-state parity 9-bits corresponding to the intermediate or the final results of 16 bytes. The shift-row circuitry 930 is arranged operably to perform step S320 for shifting rows as shown in FIG. 3, in which the structure is well-known by those artisans and is not repeated herein for brevity. The mix-column circuitry 940 is arranged operably to perform step S330 for mixing columns as shown in FIG. 3, in which the structure is well-known by those artisans and is not repeated herein for brevity. The add-round-key circuitry 950 is arranged operably to perform step S340 for adding a round key as shown in FIG. 3, in which the structure is well-known by those artisans and is not repeated herein for brevity.

The controller 870 issues the selection signal R_sel to the multiplexer 980 and the parity prediction circuitry 970 in each round to control the data flow through designated circuits. The multiplexer 980 includes three input terminals $I_0$, $I_1$ and $I_2$ and one output terminal O. The input terminal $I_0$ is coupled to the input terminal of the AES encoder 137 to receive the plaintext S of 16 bytes, the input terminal $I_1$ is coupled to the output of the mix-column circuitry 940 to receive the calculation result of 16 bytes, the input terminal 12 is coupled to the shift-row circuitry 930 to receive the calculation result of 16 bytes, and the output terminal O is coupled to the input of the add-round-key circuitry 950. Specifically, in the initial round, the controller 870 controls the multiplexer 980 to connect the input terminal $I_0$ to the output terminal O by the control signal R_sel, thereby enabling the plaintext S of 16 bytes received through the input terminal of the AES encoder 137 to be fed into the add-round-key circuitry 950. In any of the middle rounds (such as any of the $1^{st}$ to the $13^{th}$ rounds with the 256-bit key), the controller 870 controls the multiplexer 980 to connect the input terminal $I_1$ to the output terminal O by the control signal R_sel, thereby enabling the output of the mix-column circuitry 940 to be fed into the add-round-key circuitry 950. In the final round (such as the $14^{th}$ round with the 256-bit key), the controller 870 controls the multiplexer 980 to connect the input terminal $I_2$ to the output terminal O by the control signal R_sel, thereby enabling the output of the shift-row circuitry 930 to be fed into the add-round-key circuitry 950. Additionally, in the initial round, the controller 870 uses the control signal R_sel to control the parity prediction circuitry 970, so that the 16-byte plaintext S received from the input terminal of the AES encoder 137 is fed into the parity prediction circuitry 970, for generating the in-state parity bits P and the across-state parity 9-bits Q corresponding to the plaintext S. In any of the middle and final rounds, the controller 870 uses the control signal R_sel to control the parity prediction circuitry 970, so that the output of the enhanced substitute-byte circuitry 920 is fed into the parity prediction circuitry 970, for generating the in-state parity bits P and the across-state parity 9-bits Q corresponding to the intermediate results S'.

Figure 10:
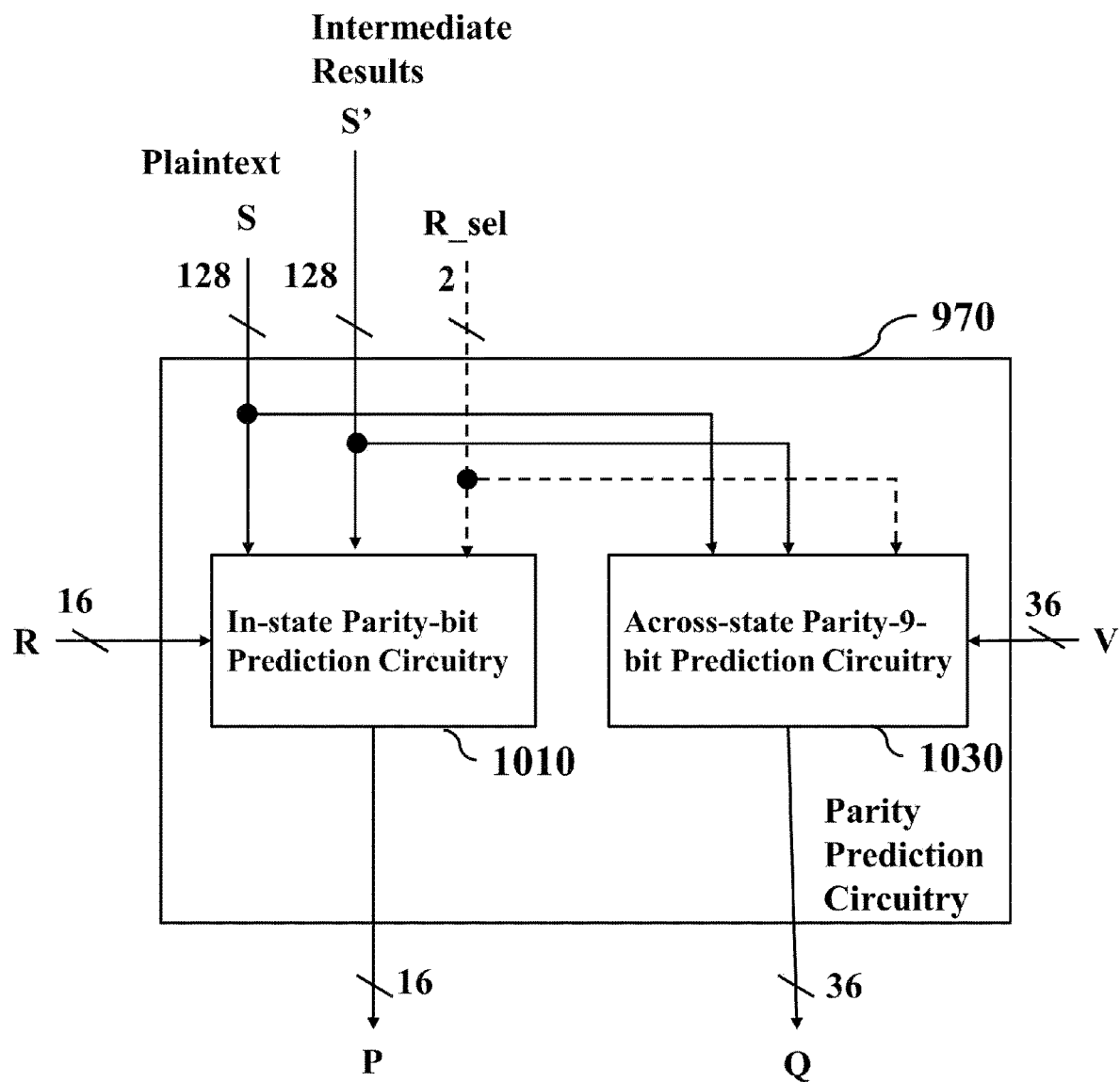
FIG. 10 is a block diagram of the parity prediction circuitry according to an embodiment of the invention.

Refer to FIG. 10 showing the block diagram of the parity prediction circuitry 970. The parity prediction circuitry 970 includes the in-state parity-bit prediction circuitry 1010 and the across-state parity-9-bit prediction circuitry 1030. The in-state parity-bit prediction circuitry 1010 selects to input the plaintext S (corresponding to the initial round) or the intermediate encryption results S' (corresponding to the middle or final round) according to the control signal R_sel, and generates in-state parity bits P according to the plaintext S/intermediate encryption results S' and in-subkey parity bits R. The across-state parity-9-bit prediction circuitry 1030 selects to input the plaintext S (corresponding to the initial round) or the intermediate encryption results S' (corresponding to the middle or final round) according to the control signal R_sel, and generates across-state parity 9-bits Q according to the plaintext S/intermediate encryption results S' and across-subkey parity 9-bits V.

Figure 11:
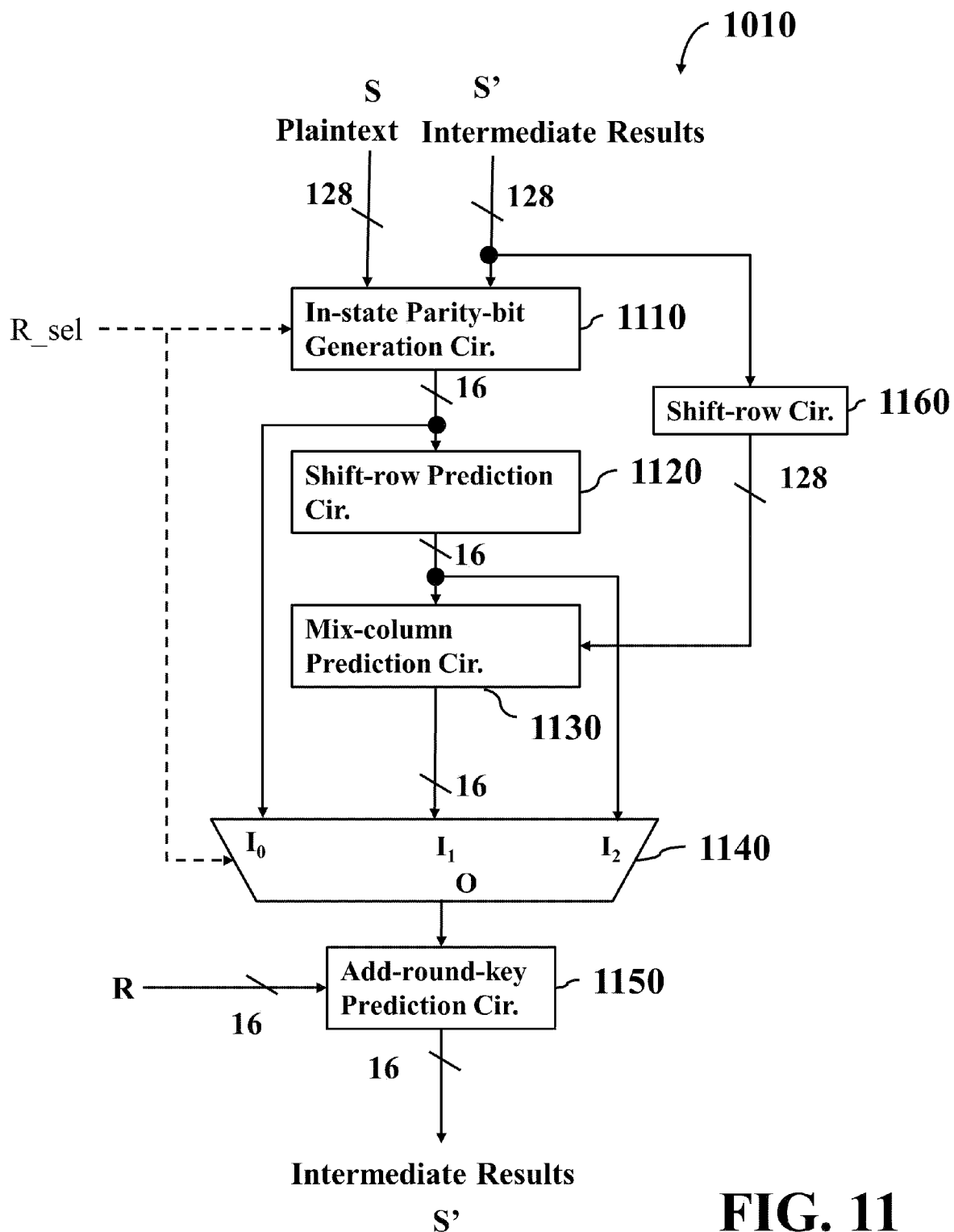
FIG. 11 is a block diagram of the in-state parity-bit prediction circuitry according to an embodiment of the invention.

Refer to FIG. 11 showing the block diagram the in-state parity-bit prediction circuitry. The controller 870 issues the selection signal R_sel to the multiplexer 1140 and the in-state parity-bit generation circuitry 1110 in each round to control the data flow through designated circuits. The multiplexer 1140 includes three input terminals $I_0$, $I_1$ and $I_2$ and one output terminal O. The input terminal $I_0$ is coupled to the output of the in-state parity-bit generation circuitry 1110 to receive the 16 bits of in-state parity, the input terminal $I_1$ is coupled to the output of the mix-column prediction circuitry 1130 to receive the calculation result of 16 bits, the input terminal 12 is coupled to the shift-row prediction circuitry 1120 to receive the calculation result of 16 bits, and the output terminal O is coupled to the input of the add-round-key prediction circuitry 1150. Specifically, in the initial round, the controller 870 uses the control signal R_sel to drive the in-state parity-bit generation circuitry 1110 to receive the plaintext of 16 bytes from the input terminal of the AES encoder 137, and control the multiplexer 1140 to connect the input terminal $I_0$ to the output terminal O, thereby enabling the 16 bits of in-state parity corresponding to the plaintext S received from the output of the in-state parity-bit generation to be fed into the add-round-key prediction circuitry 1150. In any of the middle rounds (such as any of the $1^{st}$ to the $13^{th}$ rounds with the 256-bit key), the controller 870 uses the control signal R_sel to drive the in-state parity-bit generation circuitry 1110 to obtain the intermediate encryption results S' of 16 bytes from the data register 912 and control the multiplexer 1140 to connect the input terminal $I_1$ to the output terminal O, thereby enabling the 16 bits of the in-state parity corresponding to the intermediate encryption results S', which is received from the output of the mix-column prediction circuitry 1130, to be fed into the add-round-key prediction circuitry 1150. In the final round (such as the $14^{th}$ round with the 256-bit key), the controller 870 uses the control signal R_sel to drive the in-state parity-bit generation circuitry 1110 to obtain the intermediate encryption results S' of 16 bytes from the data register 912 and control the multiplexer 980 to connect the input terminal $I_2$ to the output terminal O, thereby enabling the 16 bits of the in-state parity corresponding to the intermediate encryption results S', which is received from the output of the shift-row prediction circuitry 1120, to be fed into the add-round-key prediction circuitry 1150.

Figure 12:
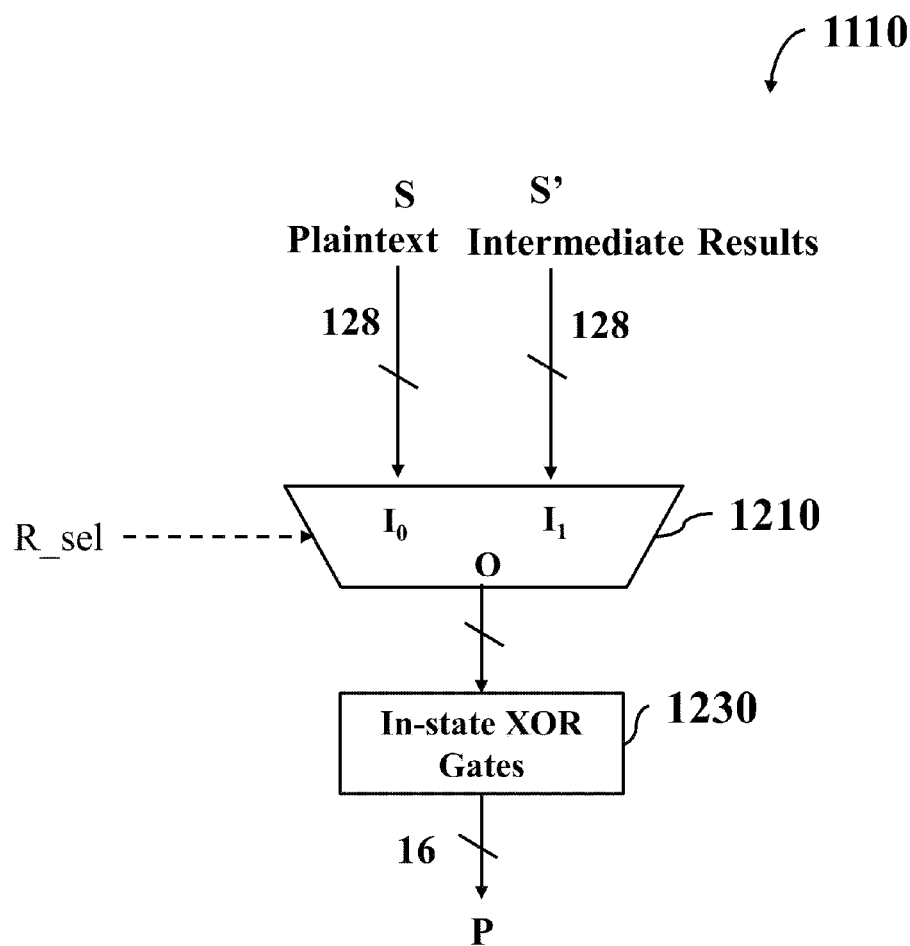
FIG. 12 is a block diagram of the in-state parity-bit generation circuitry according to an embodiment of the invention.

Refer to FIG. 12 showing the block diagram of the in-state parity-bit generation circuitry 1110. The controller 870 issues the selection signal R_sel to the multiplexer 1210 in each round to control the data flow through designated circuits. The multiplexer 1210 includes two input terminals $I_0$ and $I_1$ and one output terminal O. Specifically, in the initial round, the controller 870 controls the multiplexer 1210 to connect the input terminal $I_0$ to the output terminal O by the control signal R_sel, thereby enabling the plaintext S of 16 bytes received through the input terminal of the AES encoder 137 to be fed into the in-state XOR gates 1230. In any of the middle and final rounds (such as any of the $1^{st}$ to the $14^{th}$ rounds with the 256-bit key), the controller 870 controls the multiplexer 1210 to connect the input terminal $I_1$ to the output terminal O by the control signal R_sel, thereby enabling the intermediate encryption results S' of 16 bytes obtained from the data buffer 912 to be fed into the in-state XOR gates 1230. The in-state XOR gates 1230 includes multiple XOR gates, which are arranged operably to generate the in-state parity bits $P_0$ to $P_{15}$ as shown in FIG. 6 according to the received 16 bytes of the plaintext S or the intermediate encryption results S'.

Refer to FIG. 11, the plaintext S or the intermediate encryption results S' is or are organized as an array of 4×4 states. The shift-row circuitry 1160 circular left shifts each of the lower three rows by the predefined step(s). For example, the plaintext S is represented as follows:

$$\begin{bmatrix} S_0 & S_4 & S_8 & S_{12} \\ S_1 & S_5 & S_9 & S_{13} \\ S_2 & S_6 & S_{10} & S_{14} \\ S_3 & S_7 & S_{11} & S_{15} \end{bmatrix}$$

The shift-row circuitry 1160 circular left shifts the $1^{st}$ row by one state, circular left shifts the $2^{nd}$ row by two states and circular left shifts the $3^{rd}$ row by three states. The shifted results are represented as follows:

$$\begin{bmatrix} S_0 & S_4 & S_8 & S_{12} \\ S_5 & S_9 & S_{13} & S_1 \\ S_{10} & S_{14} & S_2 & S_6 \\ S_{15} & S_3 & S_7 & S_{11} \end{bmatrix}$$

The in-state parity bits corresponding to the plaintext S or the intermediate encryption result S' are organized an array of 4×4 bits. The shift-row prediction circuitry 1120 circular left shifts each of the lower three rows by the predefined step(s). For example, the in-state parity bits corresponding to the plaintext S are represented as follows:

$$\begin{bmatrix} P_0 & P_4 & P_8 & P_{12} \\ P_1 & P_5 & P_9 & P_{13} \\ P_2 & P_6 & P_{10} & P_{14} \\ P_3 & P_7 & P_{11} & P_{15} \end{bmatrix}$$

The shift-row prediction circuitry 1120 circular left shifts the $1^{st}$ row by one bit, circular left shifts the $2^{nd}$ row by two bits and circular left shifts the $3^{rd}$ row by three bits. The shifted results are represented as follows:

$$\begin{bmatrix} P_0 & P_4 & P_8 & P_{12} \\ P_5 & P_9 & P_{13} & P_1 \\ P_{10} & P_{14} & P_2 & P_6 \\ P_{15} & P_3 & P_7 & P_{11} \end{bmatrix}$$

The mix-column prediction circuitry 1130 coupled to the outputs of the shift-row prediction circuitry 1120 and the shift-row circuitry 1160 employs 16 formulae known by those artisans and each formula sums the designated portion of values of the shifted plaintext S or the shifted intermediate encryption results S' in the 4×4 byte-array and the designated portion of values of the shifted in-state parity bits in the 4×4 bit-array to generate the value of mixed in-state parity bit at the designated location in the 4×4 bit-array.

The add-round-key prediction circuitry 1150 employs the following formula to calculate encrypted results of in-state parity bits:

$$P_i^{(out)} = P_i^{(in)} + R_i$$

$P^{(out)}_i$ represents the output in-state parity bit for the $i^{th}$ state, $P^{(in)}_i$ represents the input in-state parity bit for the $i^{th}$ state, $R_i$ represents the $i^{th}$ in-subkey parity bit, i is an integer ranging from 0 to 15. It is to be noted that, at this time, the positions in the array corresponding to the $P^{(in)}_i$ and $P^{(out)}_i$ refer to the positions in the array output from the mix-row prediction circuitry 1130, rather than that from the in-state parity-bit generation circuitry 1110.

Figure 13:
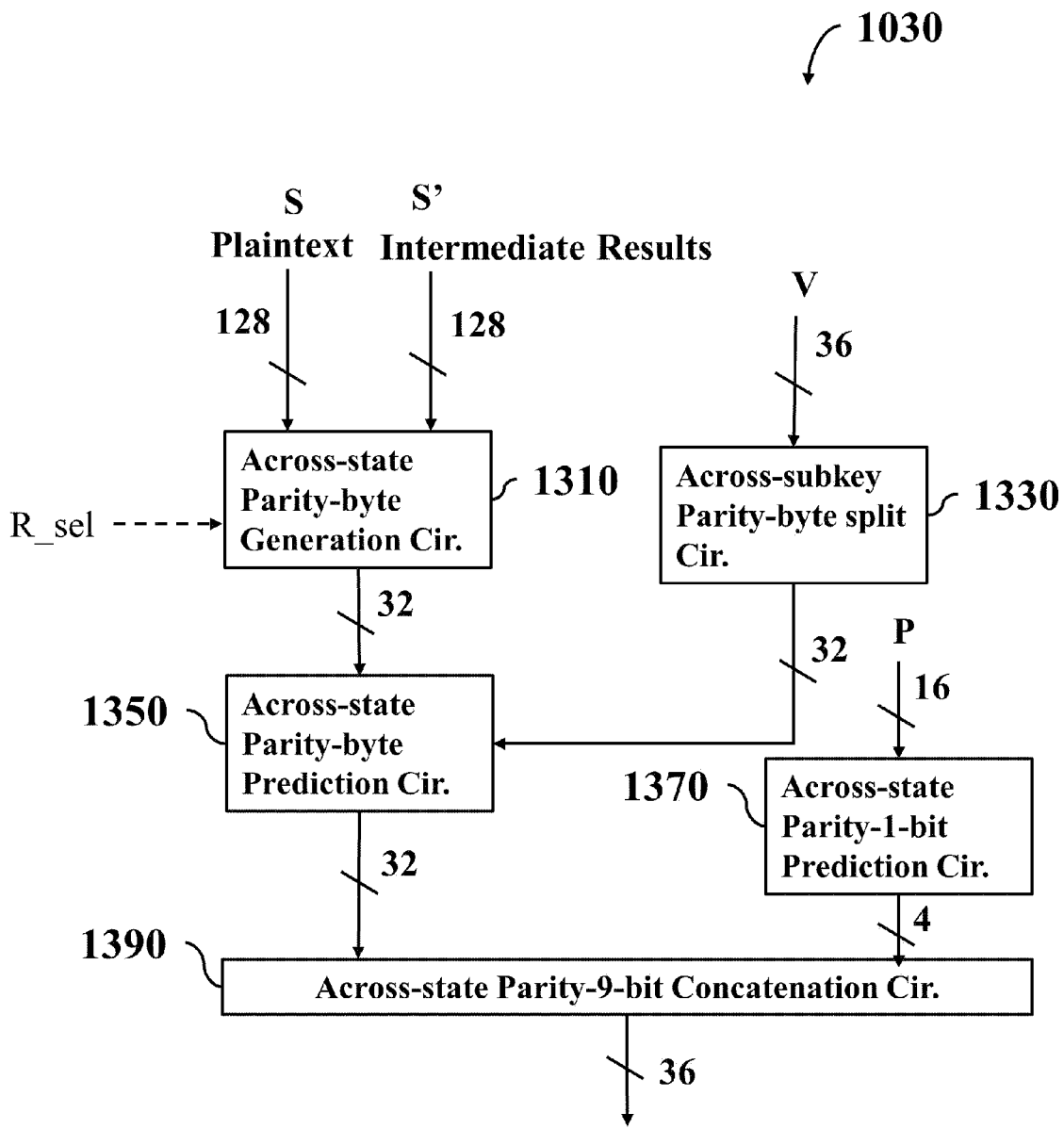
FIG. 13 is a block diagram of the across-state parity-9-bit prediction circuitry according to an embodiment of the invention.

Refer FIG. 13 showing the block diagram of the across-state parity-9-bit prediction circuitry 1030. The controller 870 issues the selection signal R_sel to the across-state parity-byte generation circuitry 1310 in each round to control the data flow fed into the across-state parity-byte generation circuitry 1310. Specifically, in the initial round, the controller 870 uses the control signal R_sel to drive the across-state parity-byte generation circuitry 1310 to receive the plaintext S of 16 bytes from the input terminal of the AES encoder 137, thereby enabling the across-state parity-byte generation circuitry 1310 to generate the across-state parity bytes according to the plaintext S of 16 bytes. In any middle round (such as any of the $1^{st}$ to the $13^{th}$ rounds with the 256-bit key) or the final round (such as the $14^{th}$ round with the 256-bit key), the controller 870 uses the control signal R_sel to drive the across-state parity-byte generation circuitry 1310 to receive the intermediate encryption results S' of 16 bytes from the data register 912, thereby enabling the across-state parity-byte generation circuitry 1310 to generate the across-state parity bytes according to the intermediate encryption results S' of 16 bytes.

The across-state parity-byte generation circuitry 1310 includes multiple XOR gates, arranged operably to generate the across-state parity bytes $Q_{0,0\ldots7}$ to $Q_{3,0\ldots7}$ (excluding the $8^{th}$ bit corresponding to the in-state parity bit) as shown in FIG. 6 according to the received plaintext S of 16 bytes in the initial round. The XOR gates are arranged operably to calculate the across-state parity bytes $Q_{0,0\ldots7}$ to $Q_{3,0\ldots7}$ (excluding the $8^{th}$ bit corresponding to the in-state parity bit) according to the received intermediate encryption results S' in the middle or final round by employing the following formulae:

$$Q_{0,j} = S'_{0,j} + S'_{5,j} + S'_{10,j} + S'_{15,j}, \text{ for } j = 0\sim7$$

$$Q_{1,j} = S'_{4,j} + S'_{9,j} + S'_{14,j} + S'_{3,j}, \text{ for } j = 0\sim7$$

$$Q_{2,j} = S'_{8,j} + S'_{13,j} + S'_{2,j} + S'_{7,j}, \text{ for } j = 0\sim7$$

$$Q_{3,j} = S'_{12,j} + S'_{1,j} + S'_{6,j} + S'_{11,j}, \text{ for } j = 0\sim7$$

$Q_{0,j}$ to $Q_{3,j}$ represent the values of the $j^{th}$ bits of the $0^{th}$ to the $3^{rd}$ across-state parity bytes, respectively, and $S'_{0,j}$ to $S'_{15,j}$ represent the values of the $j^{th}$ bits of the $0^{th}$ to the $15^{th}$ intermediate encryption results, respectively.

The across-subkey parity-byte split circuitry 1330 removes the $8^{th}$ bit from each across-subkey parity-9-bit to form the across-subkey parity byte, and feeds the across-subkey parity byte into the across-state parity-byte prediction circuitry 1350.

The across-state parity-byte prediction circuitry 1350 calculates the prediction result for each across-state parity byte by employing the following formulae:

$$Q_{0,j}^{(out)} = \sum_{i=0}^{3} Q_{i,j}^{(in)} + V_{0,j}, \text{ for } j = 0\sim7$$

$$Q_{1,j}^{(out)} = \sum_{i=4}^{7} Q_{i,j}^{(in)} + Q_{1,j}, \text{ for } j = 0\sim7$$

-continued $$Q_{2,j}^{(out)} = \sum_{i=8}^{11} Q_{i,j}^{(in)} + V_{2,j}, \text{ for } j = 0 \sim 7$$

$$Q_{3,j}^{(out)} = \sum_{i=12}^{15} Q_{i,j}^{(in)} + V_{3,j}, \text{ for } j = 0 \sim 7$$

$Q^{(out)}_{0,j}$ represents the output value of the $j^{th}$ bit of the $0^{th}$ across-state parity byte, $Q^{(out)}_{1,j}$ represents the output value of the $j^{th}$ bit of the $1^{st}$ across-state parity byte, $Q^{(out)}_{2,j}$ represents the output value of the $j^{th}$ bit of the $2^{nd}$ across-state parity byte, $Q^{(out)}_{3,j}$ represents the output value of the $j^{th}$ bit of the $3^{rd}$ across-state parity byte, $Q^{(in)}_{i,j}$ represents the input value of the $j^{th}$ bit of the $i^{th}$ across-state parity byte, $V_{i,j}$ represents the value of the $j^{th}$ bit of the $i^{th}$ across-subkey parity byte.

The across-state parity-1-bit predication circuitry 1370 calculates the prediction result for the $8^{th}$ bit of each across-state parity-9-bit by employing the following formulae:

$$Q_{0,8} = \sum_{i=0}^{3} P_{i,8}$$

$$Q_{1,8} = \sum_{i=4}^{7} P_{i,8}$$

$$Q_{2,8} = \sum_{i=8}^{11} P_{i,8}$$

$$Q_{3,8} = \sum_{i=14}^{17} P_{i,8}$$

$Q_{0,8}$ represents the value of the $8^{th}$ bit of the across-state parity-9-bit for the $0^{th}$ column, $Q_{1,8}$ represents the value of the $8^{th}$ bit of the across-state parity-9-bit for the $1^{st}$ column, $Q_{2,8}$ represents the value of the $8^{th}$ bit of the across-state parity-9-bit for the $2^{nd}$ column, $Q_{3,8}$ represents the value of the $8^{th}$ bit of the across-state parity-9-bit for the $3^{rd}$ column, $P_{i,8}$ represents the value of the in-state parity bit (i.e. the $8^{th}$ bit) for the $i^{th}$ state.

The across-state parity-9-bit concatenation circuitry 1390 appends the corresponding $8^{th}$ bit output from the across-state parity-1-bit prediction circuitry 1370 to the across-state parity byte output from the across-state parity-byte prediction circuitry 1350 to form the whole across-state parity-9-bit.

Refer to FIG. 9. The parity check circuitry 960 detects whether an error occurred in the execution results generated in the previous round. The parity check circuitry 960 obtains the intermediate encryption results S' from the data register 912 and obtains the in-state parity bits P and the across parity 9-bits Q, which correspond to the intermediate encryption results S', from the parity register 914. The parity check circuitry 960 determines whether the intermediate encryption results S' matches the in-state parity bits P. If the two are not matched, then the parity check circuitry 960 outputs the linear error signal err_L=1 to the processing unit 134, so that the processing unit 134 would execute a handling procedure in response to the AES encryption error. The parity check circuitry 960 further determines whether the intermediate encryption results S' with the in-state parity bits P matches the across parity 9-bits Q. If the two are not matched, then the parity check circuitry 960 outputs the linear error signal err_L=1 to the processing unit 134.

Figure 14:
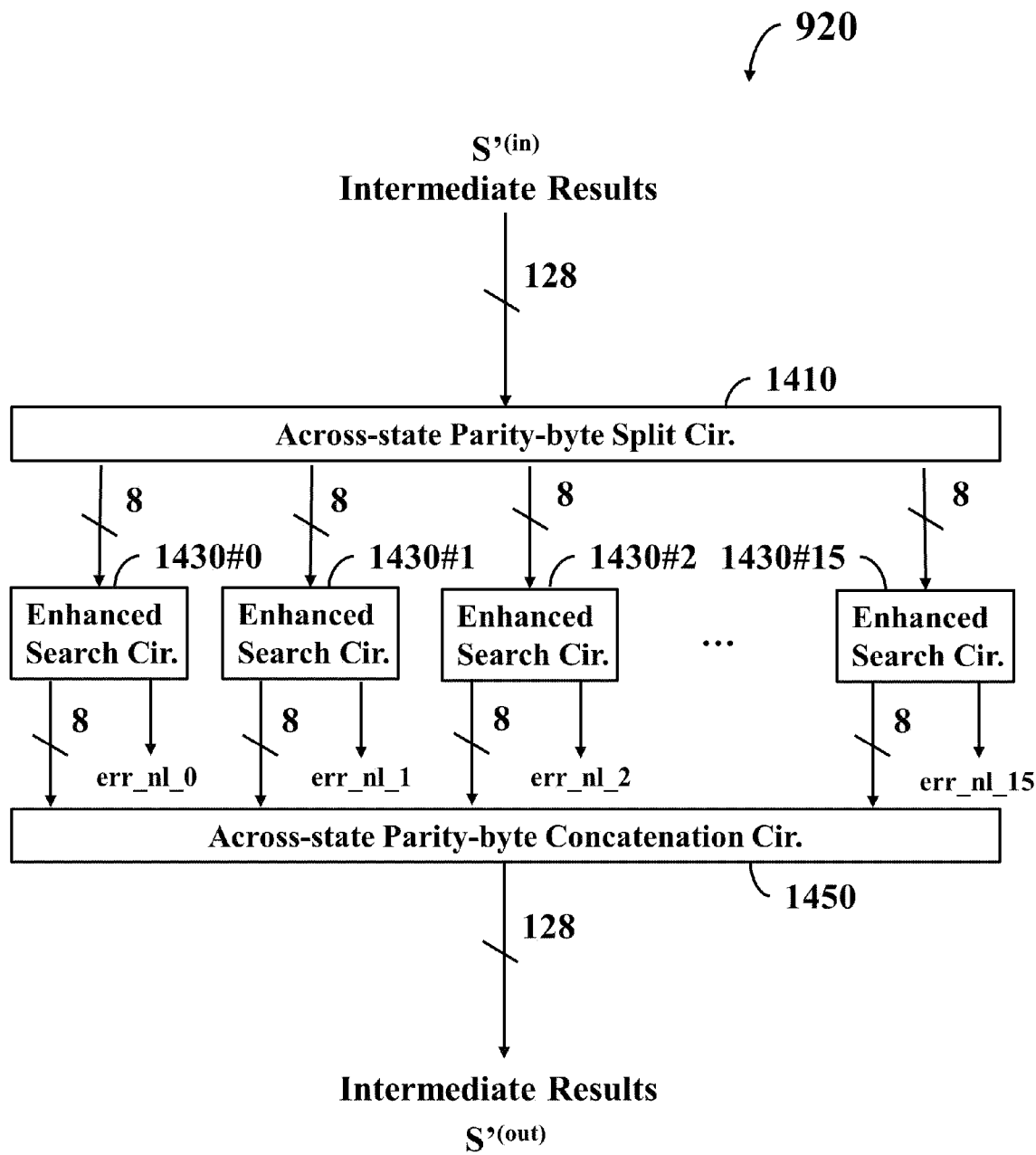
FIG. 14 is a block diagram of the enhanced substitute-byte circuitry according to an embodiment of the invention.

In addition to complete step S310 for substituting bytes in the algorithm, the enhanced substitute-byte circuitry 920 detects whether the execution of this step is correct. Refer to FIG. 14 showing the block diagram of the enhanced substitute-byte circuitry 920. The across-state parity-byte split circuitry 1410 obtains the intermediate results S' of 128 bits, divides that into 16 bytes, and feeds the 16 bytes into the enhanced search circuitries 1430 #0 to 1430 #15. Each of the enhanced search circuitries 1430 #0 to 1430 #15 completes step S310 for substituting bytes and determines whether the operation is correct. Any of the enhanced search circuitries 1430 #0 to 1430 #15, which finds an error in the operation, outputs the nonlinear error signal err_nl_i=1, i is an integer ranging from 0 to 15. If any enhanced search circuitry outputs the nonlinear error signal err_nl_i=1, then the enhanced substitute-byte circuitry 920 outputs the nonlinear error signal err_nL=1 to the processing unit 134, so that the processing unit 134 would execute a handling procedure in response to the AES encryption error. The across-state parity-byte concatenation circuitry 1450 collects the look-up results from the enhanced search circuitries 1430 #0 to 1430 #15 and outputs the converted 128 bits to the shift-row circuitry 930.

Figure 15:
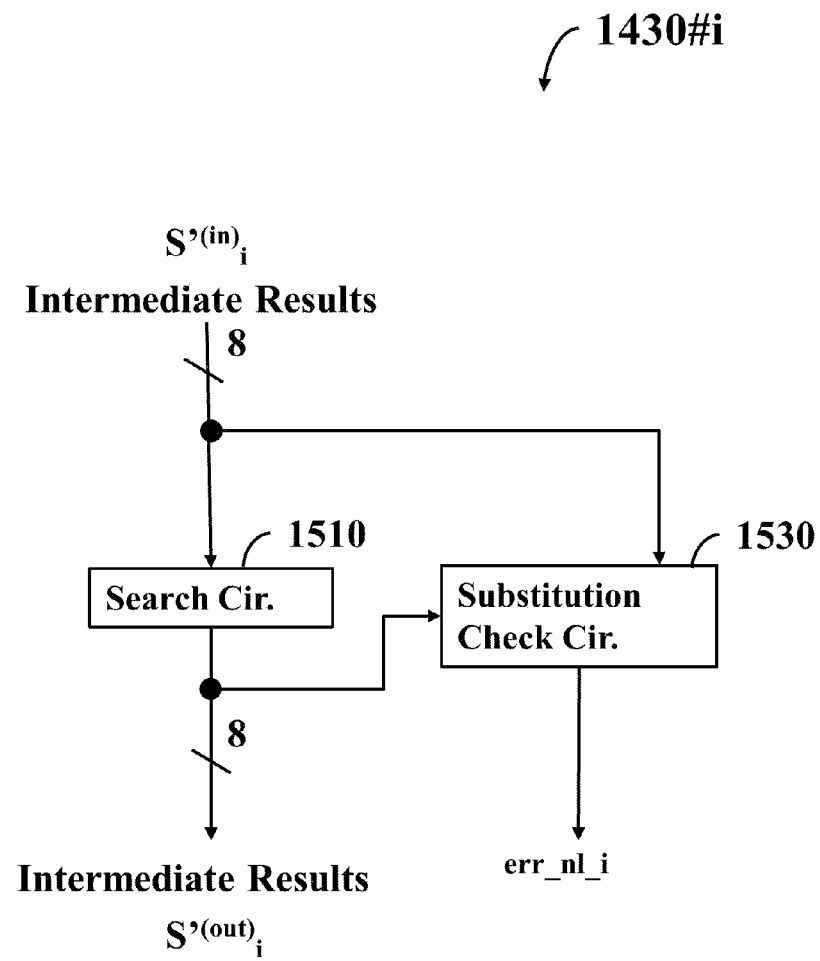
FIG. 15 is a block diagram of the enhanced search circuitry according to an embodiment of the invention.

In some embodiments, refer to FIG. 15 showing the block diagram of the enhanced search circuitry 1430 #i, i is an integer ranging from 0 to 15. The search circuitry 1510 converts the input one byte $S'^{(in)}$ into another byte $S'^{(out)}$ according to the lookup table as described above. The substitution check circuitry 1530 receives the converted one byte $S'^{(out)}$ and employs formulae corresponding to the lookup table to determine whether an error is occurred during the conversion of $S'^{(in)}$ into $S'^{(out)}$. If an error is found, then the substitution check circuitry 1530 outputs the nonlinear error signal err_nl_i=1.

Figure 16:
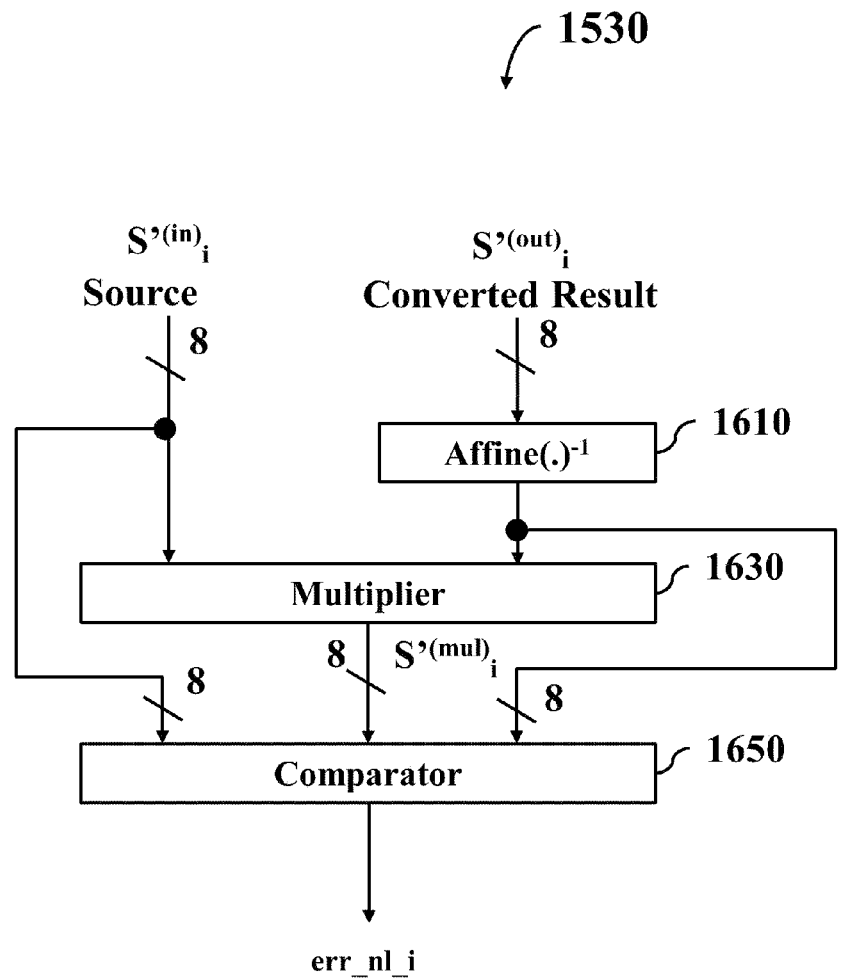
FIG. 16 is a block diagram of the substitution check circuitry according to an embodiment of the invention.

Refer to FIG. 16 showing the block diagram of the substitution check circuitry 1530. The computation circuitry 1610 obtains the converted byte $S'^{(out)}_i$, calculates $\text{Affine}(S'^{(out)}_i)^{-1}$ and outputs the calculation result to the multiplier 1630 and the comparator 1650, where $\text{Affine}(\ )^{-1}$ represents the inverse function of the Affine transformation. The multiplier 1630 multiplies $S'^{(in)}_i$ by $\text{Affine}(S'^{(out)}_i)^{-1}$ to produce $S'^{(mul)}_i$. The comparator 1650 implements the following logic operations to generate the judgment result:

$$\text{err\_nl\_i} = 0, \text{ if } \left(S'^{(mul)}_i == 1\right) \&\& \left(S'^{(in)}_i != 0\right) \&\& \left(\text{Affine}(S'^{(out)}_i)^{-1} != 0\right)$$

$$\text{err\_nl\_i} = 0, \text{ if } \left(S'^{(mul)}_i == 0\right) \&\& \left(S'^{(in)}_i == 0\right) \&\& \left(\text{Affine}(S'^{(out)}_i)^{-1} == 0\right)$$

$$\text{err\_nl\_i} = 1, \text{ otherwise}$$

It means that the nonlinear error occurred when err_nl_i equals one.

In alternative embodiments, step S310 may use the 8-to-K lookup table (also referred to as S-box) to convert the value of each state into another value, where K is an integer ranging from 10 to 15. The most-significant 8 bits of each cell in the 8-to-K lookup table are established by the formula as follows:

$$SB_i = \text{Affine}\left((i)^{-1}\right), \text{ for } i = 0 \sim 127$$

Figure 22:
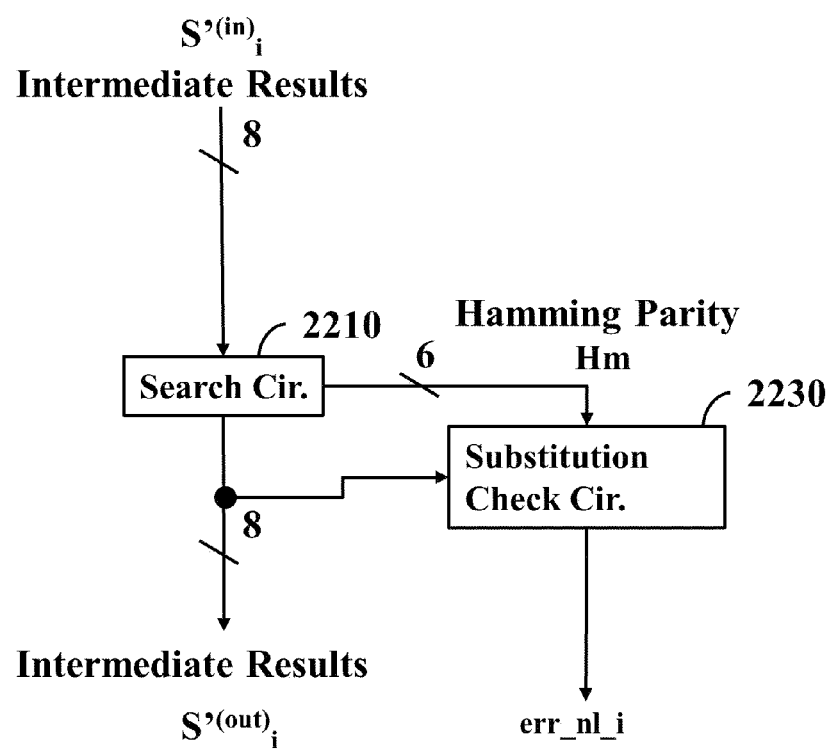
FIG. 22 is a block diagram of the enhanced search circuitry according to an embodiment of the invention.

$SB_i$ represents the output result of a value i, $\text{Affine}(\ )$ represents the Affine transformation function, and i is an integer ranging from 0 to 127. The other bits of each cell in the 8-to-K lookup table form the Hamming parity, and these K−8 (K minus 8) bits are generated by using K−8 different formulae according to the corresponding most-significant 8 bits. Refer to FIG. 22 showing the block diagram of the enhanced search circuitry 1430 #i, where i is an integer ranging from 0 to 15. For example, the search circuitry 1510 converts the input one byte $S'^{(in)}$ into another one byte $S'^{(out)}$ with 6-bit Hamming parity Hm according to the 8-to-14 lookup table. The substitution check circuitry 2230 receives the converted one byte $S'^{(out)}$ with 6-bit Hamming parity Hm and employs six formulae corresponding to the 8-to-14 lookup table to determine whether an error is occurred during the conversion of $S'^{(in)}$ into $S'^{(out)}$. If an error is found, then the substitution check circuitry 2230 outputs the non-linear error signal err_nl_i=1.

The following two examples are given to illustrate the operation of the substitution check circuitry 2230. In the first example, refer to FIG. 23 showing the 8-to-14 lookup table 2300. For the convenience of illustration, each cell in the 8-to-14 lookup table 2300 contains 4 hexadecimal numbers, but the $1^{st}$ to $0^{th}$ bits are dummy values, which are always "0b00". In actual operation, the search circuitry 2210 only outputs 14-bit results. For example, theoretically, the search circuitry 2210 converts the byte $S'^{(in)}$ "0b00000000" into the 14-bit "0b01100011010111" (the hexadecimal representation in FIG. 23 is "0x635C"), converts the byte $S'^{(in)}$ "0b00000001" into the 14-bit "0b01111100110001" (the hexadecimal representation in FIG. 23 is "0x7CC8"), and so on, according to the 8-to-14 lookup table 2300. The converted $13^{th}$ to $6^{th}$ bits are the most-significant byte to conform to the above formula, and the converted $5^{th}$ to $0^{th}$ bits are a Hamming parity. If an error occurs during the conversion, the substitution check circuitry 2230 discovers that the converted most-significant byte (that is, the $13^{th}$ to $6^{th}$ bits) $S'^{(out)}$ mismatches with the converted Hamming parity (that is, the $5^{th}$ to $0^{th}$ bits).

To conform to the 8-to-14 lookup table 2300 in FIG. 23, the substitution check circuitry 2230 uses the following 6 check formulae to analyze the 6 bits of the Hamming parity according to the converted most-significant byte $S'^{(out)}$:

$$Hm_5 == S_7'^{(out)} + S_6'^{(out)} + S_5'^{(out)} + S_4'^{(out)} + S_3'^{(out)} + S_2'^{(out)} + S_1'^{(out)} + S_0'^{(out)}$$

$$Hm_4 == S_7'^{(out)} + S_4'^{(out)} + S_0'^{(out)}$$

$$Hm_3 == S_6'^{(out)} + S_5'^{(out)} + S_1'^{(out)} + S_0'^{(out)}$$

$$Hm_2 == S_4'^{(out)} + S_2'^{(out)} + S_1'^{(out)}$$

$$Hm_1 == S_5'^{(out)} + S_3'^{(out)} + S_2'^{(out)}$$

$$Hm_0 == S_7'^{(out)} + S_6'^{(out)} + S_3'^{(out)}$$

where $Hm_5$ to $Hm_0$ represent the $5^{th}$ bit to the $0^{th}$ bit of the Hamming parity, respectively, and $S'^{(out)}_7$ to $S'^{(out)}_0$ represent the $7^{th}$ bit to the $0^{th}$ bit of the converted most-significant byte, respectively. It is determined that there is a mismatch between the converted most-significant byte $S'^{(out)}$ and the converted Hamming parity Hm, and an error is found when the substitution check circuitry 2230 detects that any one or more of the check formulae are invalid.

In the second example, refer to FIG. 24 showing the 8-to-14 lookup table 2400. For the convenience of illustration, each cell in the 8-to-14 lookup table 2400 contains 4 hexadecimal numbers, but the $1^{st}$ to $0^{th}$ bits are dummy values, which are always "0b00". Similarly, in actual operation, the search circuitry 2210 only outputs 14-bit results. For example, theoretically, the search circuitry 2210 converts the byte $S'^{(in)}$ "0b00000000" into the 14-bit "0b01100011011000" (the hexadecimal representation in FIG. 23 is "0x6360"), converts the byte $S'^{(in)}$ "0b00000001" into the 14-bit "0b01111100110001" (the hexadecimal representation in FIG. 23 is "0x7CC8"), and so on, according to the 8-to-14 lookup table 2300. The converted $13^{th}$ to $6^{th}$ bits are the most-significant byte to conform to the above formula, and the converted $5^{th}$ to $0^{th}$ bits are a Hamming parity. If an error occurs during the conversion, the substitution check circuitry 2230 discovers that the converted most-significant byte (that is, the $13^{th}$ to $6^{th}$ bits) $S'^{(out)}$ mismatches with the converted Hamming parity (that is, the $5^{th}$ to $0^{th}$ bits).

To conform to the 8-to-14 lookup table 2400 in FIG. 24, the substitution check circuitry 2230 uses the following 6 check formulae to analyze the 6 bits of the Hamming parity according to the converted most-significant byte $S'^{(out)}$:

$$Hm_5 == S_7'^{(out)} + S_6'^{(out)} + S_5'^{(out)} + S_4'^{(out)} + S_3'^{(out)} + S_2'^{(out)} + S_1'^{(out)} + S_0'^{(out)}$$

$$Hm_4 == S_7'^{(out)} + S_4'^{(out)} + S_0'^{(out)}$$

$$Hm_3 == S_5'^{(out)} + S_2'^{(out)} + S_1'^{(out)} + S_0'^{(out)}$$

$$Hm_2 == S_6'^{(out)} + S_4'^{(out)} + S_1'^{(out)}$$

$$Hm_1 == S_6'^{(out)} + S_5'^{(out)} + S_3'^{(out)}$$

$$Hm_0 == S_7'^{(out)} + S_3'^{(out)} + S_2'^{(out)}$$

where $Hm_5$ to $Hm_0$ represent the $5^{th}$ bit to the $0^{th}$ bit of the Hamming parity, respectively, and $S'^{(out)}_7$ to $S'^{(out)}_0$ represent the $7^{th}$ bit to the $0^{th}$ bit of the converted most-significant byte, respectively. It is determined that there is a mismatch between the converted most-significant byte $S'^{(out)}$ and the converted Hamming parity Hm, and an error is found when the substitution check circuitry 2230 detects that any one or more of the check formulae are invalid.

The data register 912, the search circuitry 1510, the shift-row circuitry 930, the mix-column circuitry 940, and multiplexer 980 and the add-round-key circuitry 1530 may be considered as the AES encoding circuitry collectively. The parity register 914, the substitution check circuitry 1530, the parity check circuitry 960 and the parity prediction circuitry 970 may be considered as the error detection circuitry collectively.

Figure 17:
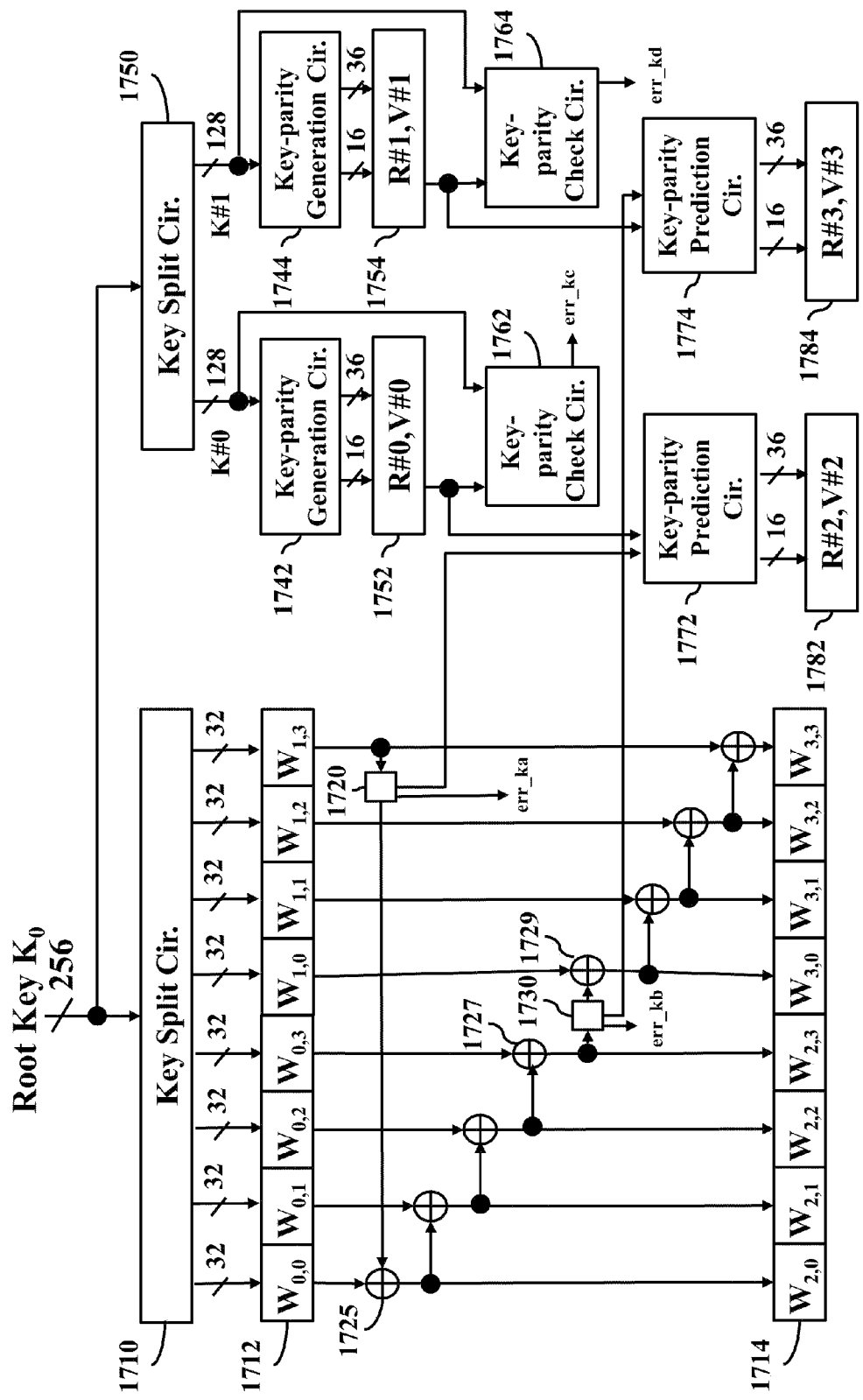
FIG. 17 is a block diagram of the AES key schedule circuitry according to an embodiment of the invention.

Refer to FIG. 17 showing the block diagram of the AES key schedule circuitry 830. The key split circuitry 1750 divides the root key $K_0$ into two keys K #0 and K #1 and each key is 128 bits, which is the same as the length of one state. The key-parity generation circuitry 1742 includes multiple XOR gates, which are arranged operably to generate the in-subkey parity bits $R_0$ to $R_{15}$ (collectively referred to as R #0) and the across-subkey parity 9-bits $V_0$ to $V_3$ (collectively referred to as V #0) as shown in FIG. 7 according to the received key K #0, and stores the in-subkey parity bits R #0 and across-subkey parity 9-bits V #0 in the registers 1752. The key-parity generation circuitry 1744 includes multiple XOR gates, which are arranged operably to generate the in-subkey parity bits $R_{16}$ to $R_{31}$ (collectively referred to as R #1) and the across-subkey parity 9-bits $V_4$ to $V_7$ (collectively referred to as V #1) as shown in FIG. 7 according to the received key K #1, and stores the in-subkey parity bits R #1 and across-subkey parity 9-bits V #1 in the registers 1754. The registers 1752 and 1754 may be referred to as current cycle parity registers.

The key-parity check circuitries 1762 and 1764 detects whether any error is occurred during the generations of the keys K #0 and K #1, respectively. The key-parity check circuitry 1762 obtains the key K #0 from the key split circuitry 1750, and obtains the in-subkey parity bits R #0 and across-subkey parity 9-bits V #0 corresponding to the key K #0 from the register 1752. The key-parity check circuitry 1762 determines whether the key K #0 matches the in-subkey parity bits R #0. If the two are not matched, then the key-parity check circuitry 1762 outputs the key error signal err_kc=1. The key-parity check circuitry 1762 further determines whether the key K #0 with in-subkey parity bits R #0 matches the across-subkey parity 9-bits V #0. If the two are not matched, then the key-parity check circuitry 1762 outputs the key error signal err_kc=1. The key-parity check circuitry 1764 obtains the key K #1 from the key split circuitry 1750, and obtains the in-subkey parity bits R #1 and across-subkey parity 9-bits V #1 corresponding to the key K #1 from the register 1754. The key-parity check circuitry 1764 determines whether the key K #1 matches the in-subkey parity bits R #1. If the two are not matched, then the key-parity check circuitry 1764 outputs the key error signal err_kd=1. The key-parity check circuitry 1764 further determines whether the key K #1 with in-subkey parity bits R #1 matches the across-subkey parity 9-bits V #1. If the two are not matched, then the key-parity check circuitry 1764 outputs the key error signal err_kd=1. The key error signal err_kc=1 or err_kd=1 would trigger a handling procedure performed by the processing unit 134 in response to any AES key error.

The key split circuitry 1710 divides the root key $K_0$ into eight words $W_{0,0}$ to $W_{0,3}$ and $W_{1,0}$ to $W_{1,3}$, and stores the eight words in the registers 1712, where each word is 4 bytes. The word-processing circuitry 1720 generates intermediate calculation results of one word according to the last word $W_{1,3}$, so that the bitwise logical XOR operation is performed on the intermediate calculation results and the first word $W_{0,0}$ to generate the first word $W_2$,o of the key K #2. In addition to the generation of intermediate calculation results, the word-processing circuitry 1720 detects whether any error is occurred during the generation of intermediation calculation results. If so, then the word-processing circuitry 1720 outputs the key error signal err_ka=1. The key error signal err_ka=1 would trigger a handling procedure performed by the processing unit 134 in response to any AES key error.

Figure 18:
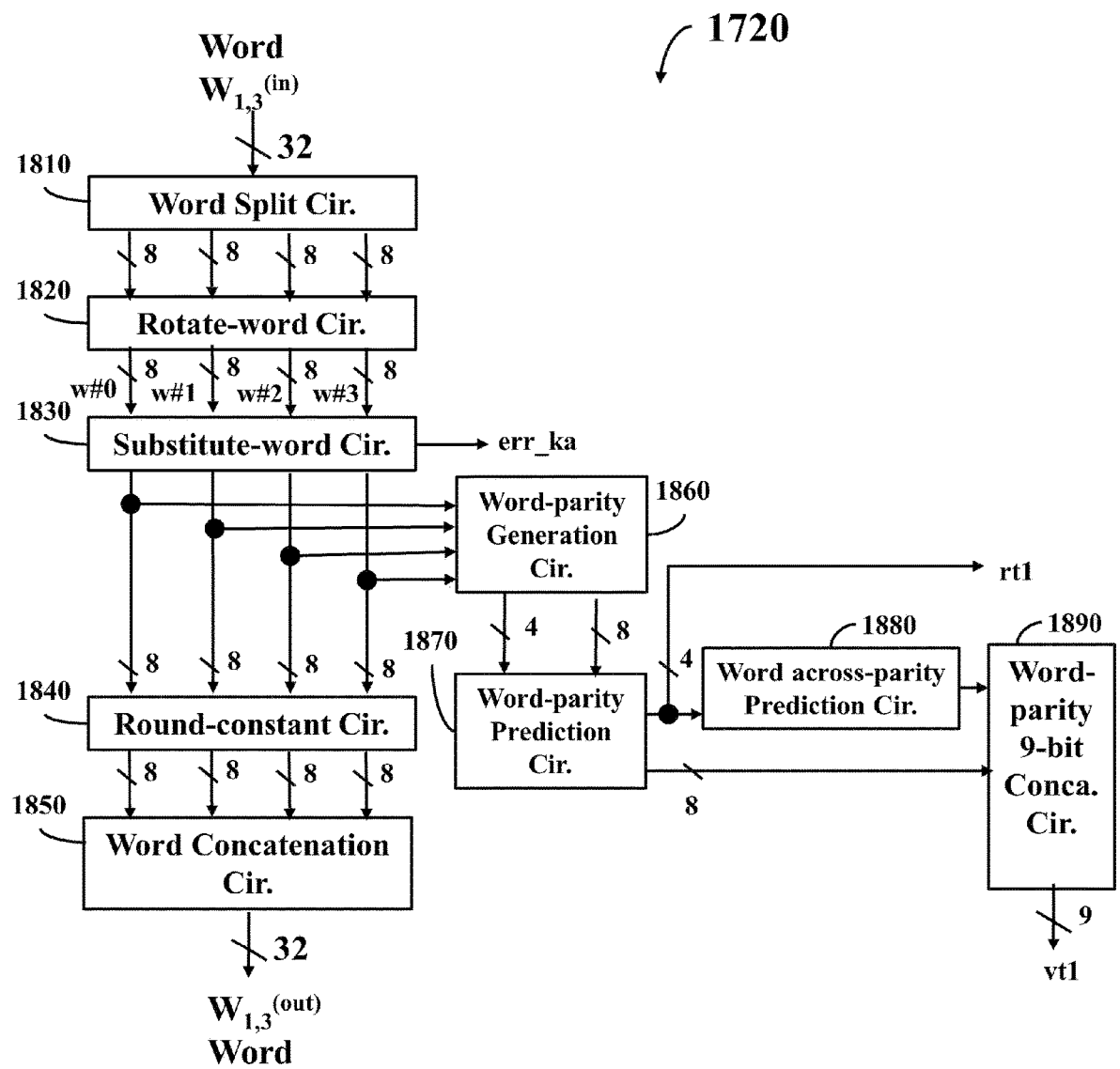
FIG. 18 is a block diagram of the word-processing circuitry according to an embodiment of the invention.

Refer to FIG. 18 showing the block diagram of the word-processing circuitry 1720. The word split circuitry 1810 reads the last word $W_{1,3}$ from the registers 1712 and divides it into four subkeys, where each subkey is one byte. The rotate-word circuitry 1820 circular left rotates the four subkeys by one subkey. The substitute-word circuitry 1830 converts the value of each shifted subkey into another value according to the lookup table (also referred to as Rijndael S-box). The lookup table is established by the formula as follows:

$$SB_i = \text{Affine}((i)^{-1}), \text{ for } i = 0 \sim 127$$

$SB_i$ represents the output result of a value i, Affine( ) represents the Affine transformation function, and i is an integer ranging from 0 to 127. In addition to the conversion for each subkey, the substitute-word circuitry 1830 checks whether each converted result is correct.

Figure 19:
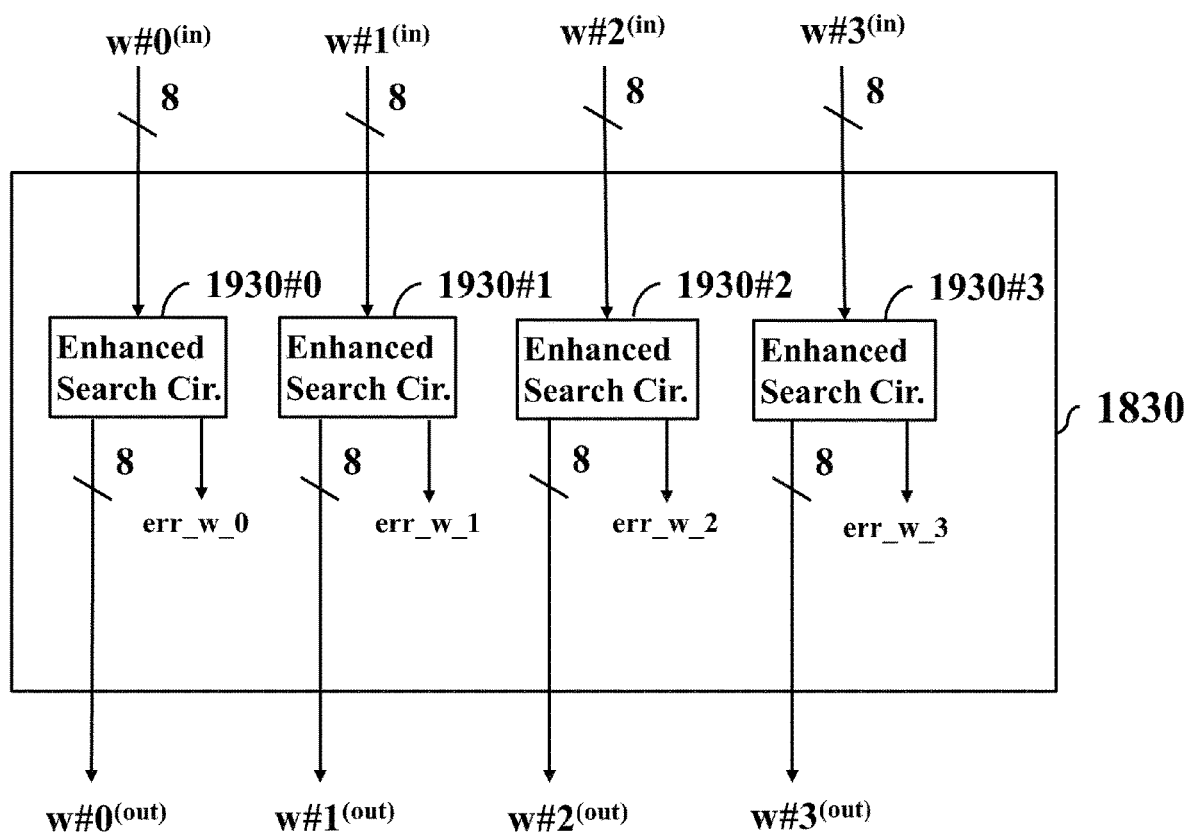
FIG. 19 is a block diagram of the substitute-word circuitry according to an embodiment of the invention.

Refer to FIG. 19 showing the block diagram of the substitute-word circuitry 1830. Each of the enhanced search circuitries 1930 #0 to 1930 #3 completes the conversion for the designated byte and determines whether the operation is correct. Any of the enhanced search circuitries 1930 #0 to 1930 #3, which finds an error in the operation, outputs the table-search error signal err_w_i=1, i is an integer ranging from 0 to 3. If any enhanced search circuitry outputs the table-search error signal err_w_i=1, then the substitute-word circuitry 1830 outputs the key error signal err_ka=1 to the processing unit 134, so that the processing unit 134 would execute a handling procedure in response to the AES encryption error. Since the circuitry structure, the functionality and the operation details of any of the enhanced search circuitries 1930 #0 to 1930 #3 are similar to that of the enhanced search circuitry 1430 #i, the reader may refer to the descriptions of FIGS. 15, 16, and 22-24 for it is not repeated herein for brevity.

Figure 20:
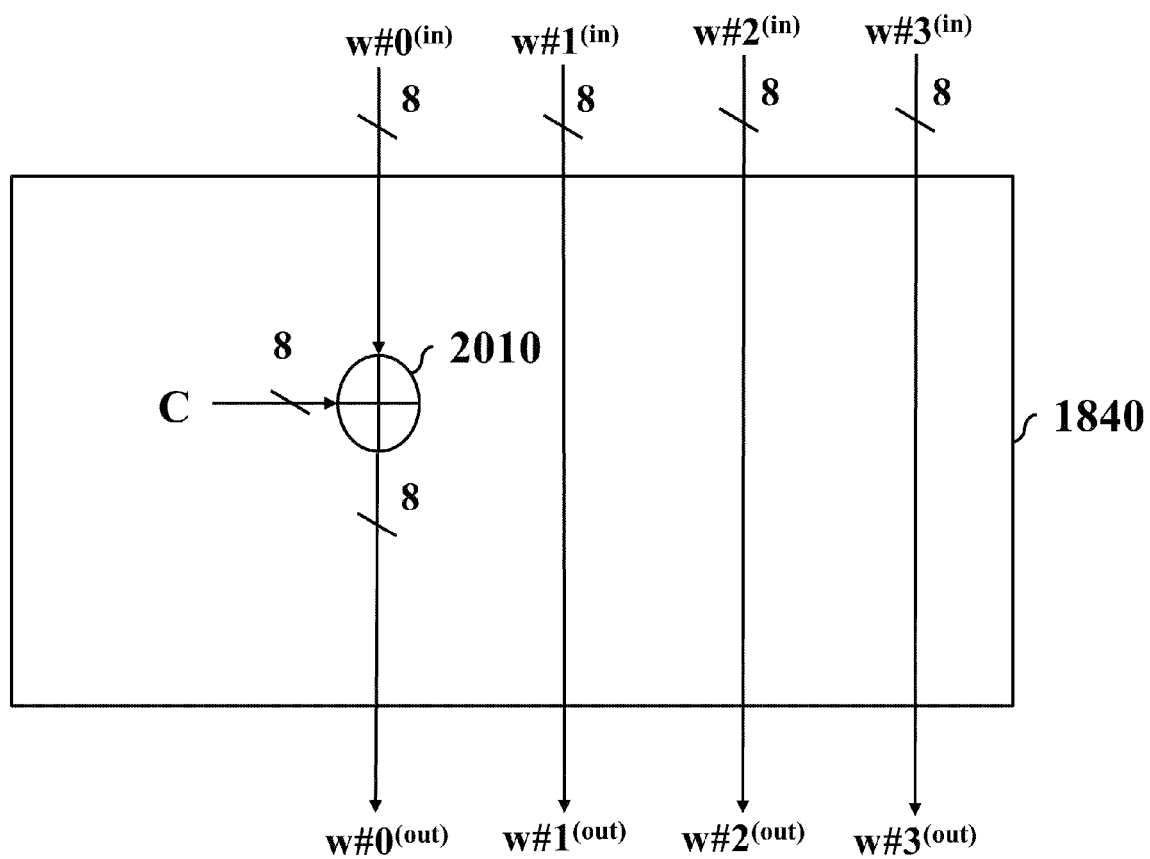
FIG. 20 is a block diagram of the round-constant circuitry according to an embodiment of the invention.

Refer to FIG. 18, the round-constant circuitry 1840 performs the bitwise XOR operation on the word w $\#0^{(in)}$ and the constant C. Refer to FIG. 20 showing the schematic diagram of the round-constant circuitry 1840. Each of the XOR gates 2010 is arranged operably to XOR a bit of the word w $\#0^{(in)}$ and its corresponding bit of the constant C.

The word concatenation circuitry 1850 obtains four subkeys w #0 to w #3 from the round-constant circuitry 1840, combines the subkeys w #0 to w #3 to form the complete word $W^{(out)}$ and outputs the word $W^{(out)}$ to the XOR gates 1725.

The word-parity generation circuitry 1860 includes an in-subkey parity generation circuitry and an across-subkey parity generation circuitry. The in-subkey parity generation circuitry includes XOR gates arranged operably to generate four in-subkey parity bits $rt1_0$ to $rt1_3$ according to the subkeys w #0 to w #3 received from the substitute-word circuitry 1830. The across-subkey generation circuitry includes XOR gates arranged operably to generate one across-subkey parity byte $vt1_{0\ldots 7}$ according to the subkeys w #0 to w #3 received from the substitute-word circuitry 1830.

The word-parity prediction circuitry 1870 includes an in-subkey parity prediction circuitry and an across-subkey parity prediction circuitry. The in-subkey parity prediction circuitry predicts the in-subkey parity bit $rt1_0^{(out)}$ by employing the formula as follows:

$$rt1_0^{(out)} = rt1_0^{(in)} + \sum_{i=0}^{7} C_i$$

$rt1_0^{(out)}$ represents the calculated $0^{th}$ in-subkey parity bit, $rt1_0^{(in)}$ represents the $0^{th}$ in-subkey parity bit received from the word-parity generation circuitry 1860, $C_i$ represents the $i^{th}$ bit of the constant C used in the round-constant circuitry 1840. The in-subkey parity prediction circuitry outputs the in-subkey parity bit $rt1_0^{(out)}$ to the word cross-parity prediction circuitry 1880 and the key-parity prediction circuitry 1772. Additionally, the in-subkey parity prediction circuitry outputs the in-subkey parity bits $rt1_0$ to $rt1_3$ to the word cross-parity prediction circuitry 1880 and the key-parity prediction circuitry 1772. The across-subkey parity prediction circuitry predicts the across-subkey parity byte by employing the formula as follows:

$$vt1_{0\ldots 7}^{(out)} = vt1_{0\ldots 7}^{(in)} + C$$

$vt1_{0\ldots 7}^{(out)}$ represents the output across-subkey parity byte, $vt1_{0\ldots 7}^{(in)}$ represents the cross-subkey parity byte received from the word-parity generation circuitry 1860, C represents the constant used in the round-constant circuitry 1840. The across-subkey parity prediction circuitry outputs the predicted across-subkey parity byte to the word-parity 9-bit concatenation circuitry 1890.

The word cross-parity prediction circuitry 1880 calculates the last bit of the across-subkey parity 9-bit vt by employing the following formula:

$$vt1_8 = \sum\nolimits_{i=0}^{3} rt1_i$$

$vt1_8$ represents the last bit of the across-subkey parity 9-bit, $rt1_i$ represents the $i^{th}$ in-subkey parity bit.

The word-parity 9-bit concatenation circuitry 1890 appends the calculated result $vt1_8$ by the word cross-parity prediction circuitry 1880 to the calculated results $vt1_{0\ldots 7}$ by the word-parity prediction circuitry 1870 to form the across-word parity 9-bit $vt1_{0\ldots 8}$, and outputs the across-word parity 9-bit $vt1_{0\ldots 8}$ to the key-parity prediction circuitry 1772.

Refer to FIG. 17, the word-processing circuitry 1730 generates intermediate calculation results of one word according to the calculated results (i.e. the word $W_{2,3}$) by the XOR gates 1727. The bitwise XOR operation is performed on the intermediate calculation results and the word $W_{1,0}$ to generate the first word $W_{3,0}$ of the key K #3. In addition to the intermediate calculation results, the word processing circuitry 1730 detects whether any error is occurred during the generation of intermediate calculation results. If so, then the word processing circuitry 1730 outputs the key error signal err_kb=1. The key error signal err_kb=1 would trigger a handling procedure by the processing unit 134 in response to any AES key error.

Figure 21:
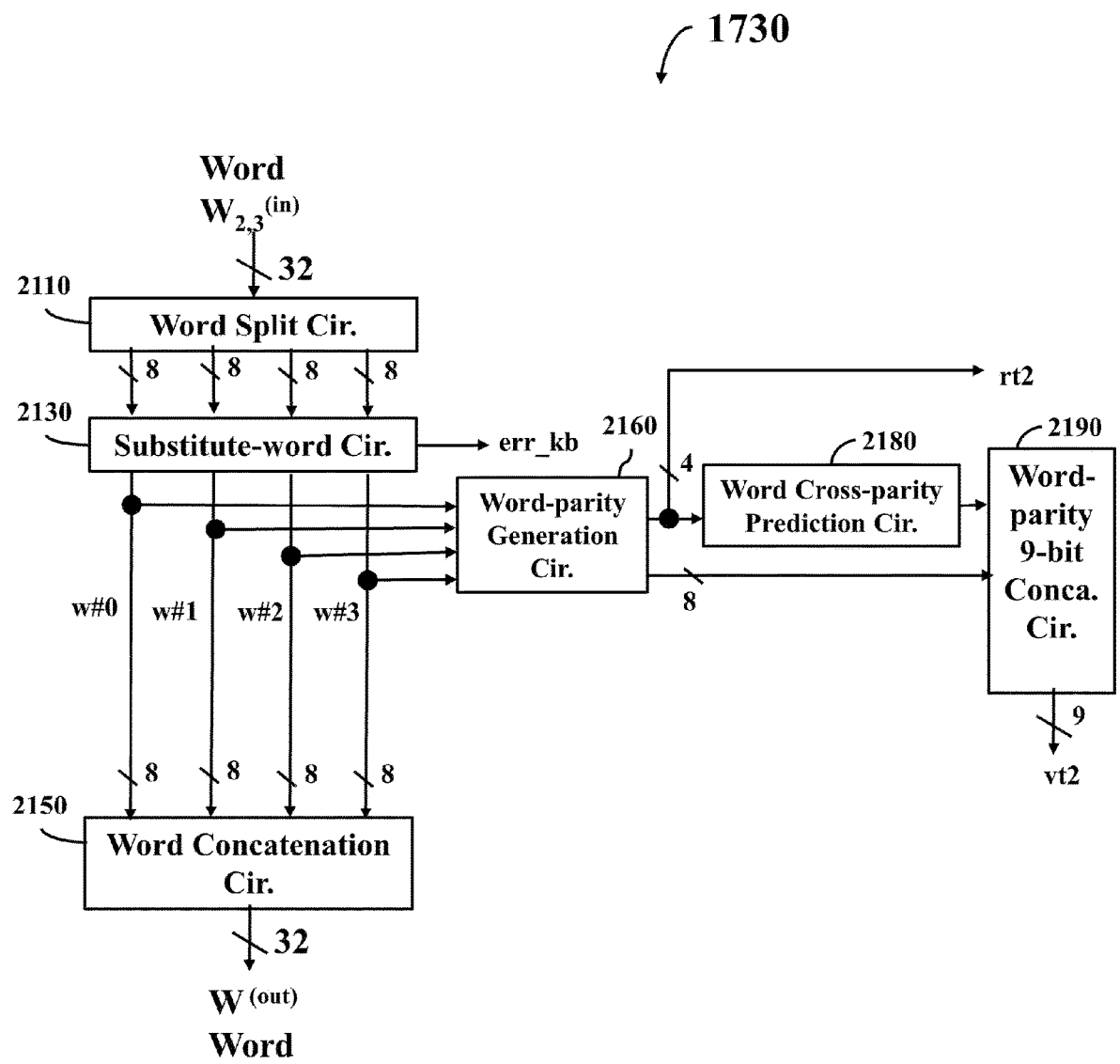
FIG. 21 is a block diagram of the word-processing circuitry according to an embodiment of the invention.

Refer to FIG. 21 showing the block diagram of the word-processing circuitry 1730. The word split circuitry 2110 reads the calculation results (i.e. the word $W_{2,3}$) from the XOR gates 1727, and divides that into four bytes. The substitute-word circuitry 2130 replaces each byte into another according to a lookup table, which is established by the formula as follows:

$$SB_i = \text{Affine}((i)^{-1}),\ \text{for } i = 0\sim 127$$

$SB_i$ represents the output result of a value i, Affine( ) represents the Affine transformation function, and i is an integer ranging from 0 to 127. In addition to the conversion for each byte, the substitute-word circuitry 2130 checks whether each converted result is correct. Since the circuitry structure, the functionality and the operation details of the substitute-word circuitry 2130 are similar to that of the substitute-word circuitry 1830, the reader may refer to the descriptions of FIGS. 15, 16 and 19 for it is not repeated herein for brevity. Any of the enhanced search circuitries in the substitute-word circuitry 2130 outputs the table-search error signal err_w_i=1, i is an integer ranging from 0 to 3, and then, the substitute-word circuitry 2130 outputs the key error signal err_kb=1 to the processing unit 134, so that the processing unit 134 would execute a handling procedure in response to the AES encryption error.

The word concatenation circuitry 2150 obtains the replaced four subkeys w #0 to w #3 from the substitute-word circuitry 2130, combines the subkeys w #0 to w #3 to form the word $W^{(out)}$ and output the word $W^{(out)}$ to the XOR gates 1729.

The word-parity generation circuitry 2160 includes an in-subkey parity generation circuitry and an across-subkey parity generation circuitry. The in-subkey parity generation circuitry includes XOR gates arranged operably to generate four in-subkey parity bits $rt2_0$ to $rt2_3$ according to the subkeys w #0 to w #3 received from the substitute-word circuitry 2130. The four in-subkey parity bits $rt2_0$ to $rt2_3$ are output to the word cross-parity prediction circuitry 2180 and the key-parity prediction circuitry 1774. The across-subkey generation circuitry includes XOR gates arranged operably to generate one across-subkey parity byte $vt2_{0\ldots 7}$ (that is, excluding the $8^{th}$ bit of the across-subkey parity 9-bit vt2) according to the subkeys w #0 to w #3 received from the substitute-word circuitry 2130. The across-subkey parity byte $vt2_{0\ldots 7}$ is output to the word-parity 9-bit concatenation circuitry 2190.

The word cross-parity prediction circuitry 2180 calculates the last bit of the across-subkey parity 9-bit corresponding to the subkeys w #0 to w #3 by employing the following formula:

$$vt2_8 = \sum\nolimits_{i=0}^{3} rt2_i$$

$vt2_8$ represents the last bit of the across-subkey parity 9-bit, $rt2_i$ represents the $i^{th}$ in-subkey parity bit corresponding to the subkey w #i.

The word-parity 9-bit concatenation circuitry 2190 appends the calculated result $vt2_8$ by the word cross-parity prediction circuitry 2180 to the calculated results $vt2_{0\ldots 7}$ by the word-parity prediction circuitry 2160 to form the across-word parity 9-bit $vt2_{0\ldots 8}$, and outputs the across-word parity 9-bit $vt2_{0\ldots 8}$ to the key-parity prediction circuitry 1774.

Refer to FIG. 17, the key-parity prediction circuitry 1772 includes adders, which are arranged operably to calculate the in-subkey parity bits R #$2_0$ to R #$2_{15}$ corresponding to the key K #2 by employing the following formulae:

$$R\#2_i = rt1_i + R\#0_i,\ \text{for } i = 0\sim 3$$

$$R\#2_i = R\#2_{i-4} + R\#0_i,\ \text{for } i = 4\sim 15$$

R #$2_i$ represents the $i^{th}$ in-subkey parity bit corresponding to the key K #2, $rt1_i$ represents the $i^{th}$ in-subkey parity bit obtained from the word-processing circuitry 1720, R #$0_i$ represents the $i^{th}$ in-subkey parity bit corresponding to the key K #0, which is read from the registers 1752, R #$2_{i-4}$ represents the i–$4^{th}$ in-subkey parity bit corresponding to the key K #2, which is read from the registers 1752. The key-parity prediction circuitry 1772 includes adders, which are arranged operably to calculate the across-subkey parity 9-bits V #$2_0$ to V #$2_3$ corresponding to the key K #2 by employing the following formulae:

$$V\#2_i = vt1 + V\#0_i,\ \text{for } i = 0$$

$$V\#2_i = V\#2_{i-1} + V\#0_i,\ \text{for } i = 1\sim 3$$

V #$2_i$ represents the $i^{th}$ across-subkey parity 9-bit corresponding to the key K #2, vt1 represents the across-subkey parity 9-bit obtained from the word-processing circuitry 1720, V #$0_i$ represents the $i^{th}$ across-subkey parity 9-bit corresponding to the key K #0, which is read from the registers 1752, V #2$_{i-1}$ represents the i–1$^{th}$ across-subkey parity 9-bit corresponding to the key K #2, which is read from the registers 1752. The key-parity prediction circuitry 1772 stores the prediction results R #2 and V #2 in the registers 1782, so that key-parity check circuitry 1762 would check accordingly in the next iteration.

The key-parity prediction circuitry 1774 includes adders, which are arranged operably to calculate the in-subkey parity bits R #3$_0$ to R #3$_{15}$ corresponding to the key K #3 by employing the following formulae:

$$R\#3_i = rt2_i + R\#1_i, \text{ for } i = 0{\sim}3$$

$$R\#3_i = R\#3_{i-4} + R\#1_i, \text{ for } i = 4{\sim}15$$

R #3$_i$ represents the i$^{th}$ in-subkey parity bit corresponding to the key K #3, rt2$_i$ represents the i$^{th}$ in-subkey parity bit obtained from the word-processing circuitry 1730, R #1$_i$ represents the i$^{th}$ in-subkey parity bit corresponding to the key K #1, which is read from the registers 1754, R #3$_{i-4}$ represents the i–4$^{th}$ in-subkey parity bit corresponding to the key K #3, which is read from the registers 1754. The key-parity prediction circuitry 1774 includes adders, which are arranged operably to calculate the across-subkey parity 9-bits V #3$_0$ to V #3$_3$ corresponding to the key K #3 by employing the following formulae:

$$V\#3_i = vt2 + V\#1_i, \text{ for } i = 0$$

$$V\#3_i = V\#3_{i-1} + V\#1_i, \text{ for } i = 1{\sim}3$$

V #3$_i$ represents the i$^{th}$ across-subkey parity 9-bit corresponding to the key K #3, vt2 represents the across-subkey parity 9-bit obtained from the key-processing circuitry 1730, V #1$_i$ represents the i$^{th}$ across-subkey parity 9-bit corresponding to the key K #1, which is read from the registers 1754, V #3$_{i-1}$ represents the i–1$^{th}$ across-subkey parity 9-bit corresponding to the key K #3, which is read from the registers 1754. The key-parity prediction circuitry 1774 stores the prediction results R #3 and V #3 in the registers 1784, so that key-parity check circuitry 1764 would check accordingly in the next iteration.

Although FIG. 17 merely describes the generation of keys K #2 and K #3 and their error detections during the generation process, those artisans know that keys K #2 and K #3 are used to generate the keys K #4 and K #5 (that is, the keys used in the next iteration), and so on. Those artisans would deduce the generation of other round keys and their error detections during the generation process with reference made to the above technical details.

In some embodiments, the registers 1712 and 1714 are separated registers physically, which are used to store the root key and the derived round keys in the ping-pong manner. In alternatively embodiments, the registers 1712 and 1714 indicate the same registers, which are used to store the root key and the derived round keys in the time order.

In some embodiments, the registers 1752 and 1782 are separated registers physically, which are used to store the first in-subkey parity bits R #0 with the first across-subkey parity 9-bits V #0 and the following in-subkey parity bits with the following across-subkey parity 9-bits in the ping-pong manner. In alternatively embodiments, the registers 1752 and 1782 indicate the same registers, which are used to store the first in-subkey parity bits R #0 with the first across-subkey parity 9-bits V #0 and the following in-subkey parity bits with the following across-subkey parity 9-bits in the time order.

In some embodiments, the registers 1754 and 1784 are separated registers physically, which are used to store the second in-subkey parity bits R #1 with the second across-subkey parity 9-bits V #1 and the following in-subkey parity bits with the following across-subkey parity 9-bits in the ping-pong manner. In alternatively embodiments, the registers 1754 and 1784 indicate the same registers, which are used to store the second in-subkey parity bits R #1 with the second across-subkey parity 9-bits V #1 and the following in-subkey parity bits with the following across-subkey parity 9-bits in the time order.

Figure 25:
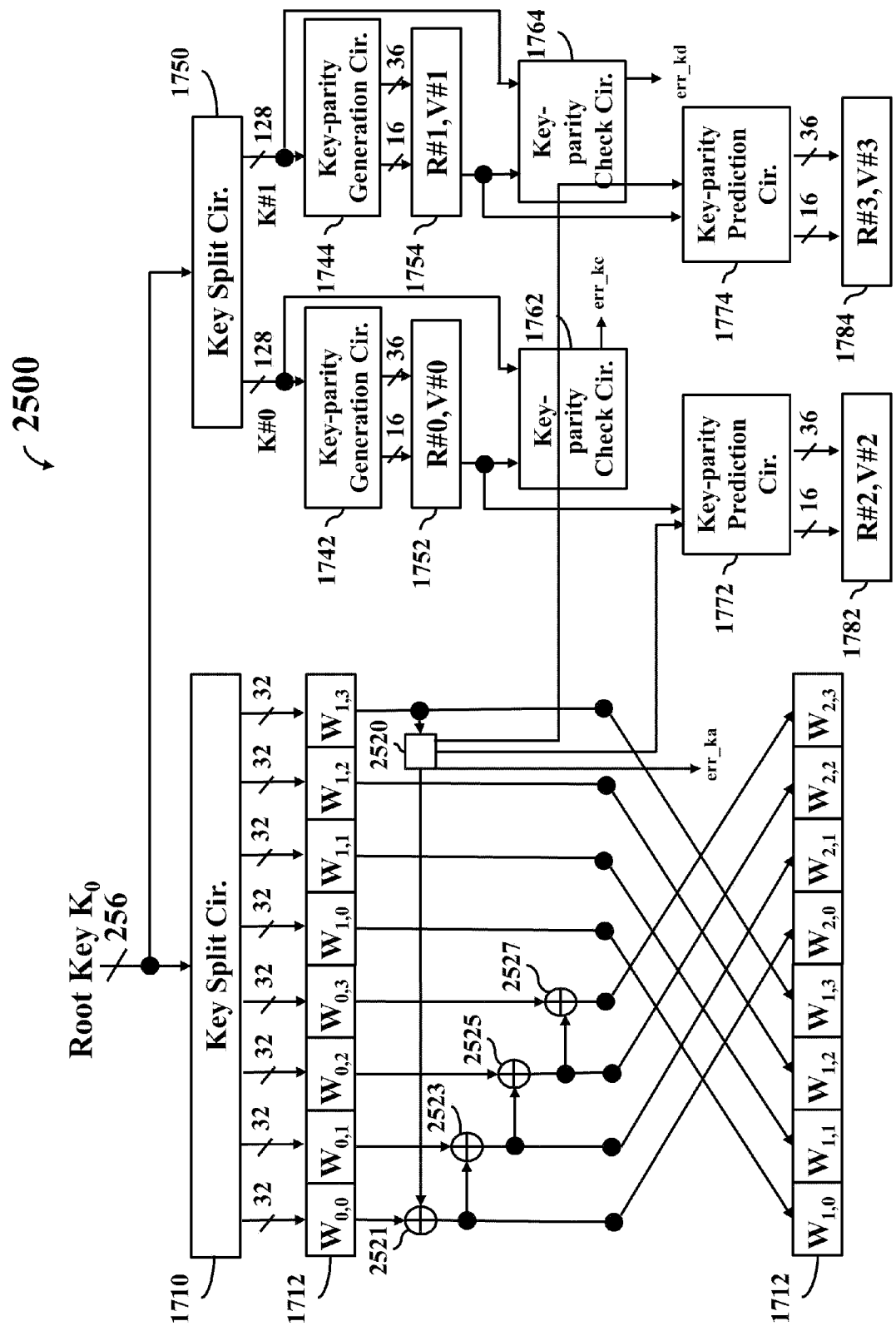
FIG. 25 is a block diagram of the AES key schedule circuitry according to an embodiment of the invention.

The AES key scheduling circuitry 830 shown in FIG. 17 can be more compact to save die size. Refer to FIG. 25 showing the block diagram of the AES key schedule circuitry 2500. The AES key scheduling circuitry includes the register 1712, which contains storage components of eight double words for storing two round keys. Initially, the key split circuitry 1710 divides the root key K$_0$ of 256 bits into eight words W$_{0,0}$ to W$_{0,3}$ and W$_{1,0}$ to W$_{1,3}$, and stores the eight words in the register 1712, in which each word is 4 bytes. The words W$_{0,0}$ to W$_{0,3}$ form the round key K #0 and the words W$_{1,0}$ to W$_{1,3}$ form the round key K #1. The outputs of the components for storing the 4$^{th}$ to the 7$^{th}$ double words are coupled to the inputs of the components for storing the 0$^{th}$ to the 3$^{rd}$ double words, respectively, so that the AES key scheduling circuitry 2500 migrates the round key stored in the space for the last four double words in the register 1712 to the space for the first four double words in the register 1712 in each clock cycle after the AES key scheduling circuitry 2500 is activated. It is to be understood that the word described herein, which contains four bytes of a key value, is the terminology used in the AES domain while the double word described herein, which contains two bytes of data, is the terminology used in the computer science domain. The word-processing circuitry 2520 coupled to the output of the last double word (i.e. the word W$_{1,3}$) calculates an intermediate calculation result W$_{tmp}$ of one word according to the last double word stored in the register 1712 and outputs the intermediate calculation result W$_{tmp}$ to the XOR gates 2521. Two input terminals of the XOR gates 2521 are coupled to the output of the 0$^{th}$ word in the register 1712 and the output of the word-processing circuitry 2520, respectively. The XOR gates 2521 are arranged operably to perform the bitwise XOR operation on the 0$^{th}$ word in the register 1712 and the output of the word-processing circuitry 2520, and output the calculation result to the components for storing the 4$^{th}$ double word in the register 1712. Two input terminals of the XOR gates 2523 are coupled to the output of the 1$^{st}$ word in the register 1712 and the output of the XOR gates 2521, respectively. The XOR gates 2523 are arranged operably to perform the bitwise XOR operation on the 1$^{st}$ word in the register 1712 and the output of the XOR gates 2521, and output the calculation result to the components for storing the 5$^{th}$ double word in the register 1712. Two input terminals of the XOR gates 2525 are coupled to the output of the 2$^{nd}$ word in the register 1712 and the output of the XOR gates 2523, respectively. The XOR gates 2525 are arranged operably to perform the bitwise XOR operation on the 2$^{nd}$ word in the register 1712 and the output of the XOR gates 2523, and output the calculation result to the components for storing the 6$^{th}$ double word in the register 1712. Two input terminals of the XOR gates 2527 are coupled to the output of the 3$^{rd}$ word in the register 1712 and the output of the XOR gates 2525, respectively. The XOR gates 2527 are arranged operably to perform the bitwise XOR operation on the $3^{rd}$ word in the register 1712 and the output of the XOR gates 2525, and output the calculation result to the components for storing the $7^{th}$ double word in the register 1712.

For example, in the $0^{th}$ clock cycle, the AES key scheduling circuitry 2500 outputs the round key K #0 (including words $W_{0,0}$ to $W_{0,3}$) to the AES data processing circuitry 810, so that the AES data processing circuitry 810 encrypts the plaintext with the round key K #0. In the $1^{st}$ clock cycle, the AES key scheduling circuitry 2500 outputs the round key K #1 (including words $W_{1,0}$ to $W_{1,3}$) to the AES data processing circuitry 810, so that the AES data processing circuitry 810 encrypts the plaintext with the round key K #1. In each clock cycle starting from the $2^{nd}$ clock cycle, the AES key scheduling circuitry 2500 updates the eight words in the register 1712 and outputs the last four words stored in the components of the register 1712 to the AES data processing circuitry 810 as a round key until all round keys are generated completely. In the $2^{nd}$ clock cycle, the last 128-bit value (i.e. the round key K #1) in the register 1712 is updated to the first 128 bits in the register 1712 and the word processing circuitry 2520 generates the intermediate calculation result $W_{tmp}$ of one word according to the last word $W_{1,3}$. The $4^{th}$ to the $7^{th}$ double words (i.e. the words $W_{2,0}$ to $W_{2,3}$) are the calculation results by the following formulae:

$$DW_4 = W_{tmp} \oplus W_{0,0}$$

$$DW_5 = W_{tmp} \oplus W_{0,0} \oplus W_{0,1}$$

$$DW_6 = W_{tmp} \oplus W_{0,0} \oplus W_{0,1} \oplus W_{0,2}$$

$$DW_7 = W_{tmp} \oplus W_{0,0} \oplus W_{0,1} \oplus W_{0,2} \oplus W_{0,3}$$

The AES key scheduling circuitry 2500 outputs the round key K #2 (including the words $W_{2,0}$ to $W_{2,3}$) to the AES data processing circuitry 810. In the $3^{rd}$ clock cycle, the last 128-bit value (i.e. the round key K #2) in the register 1712 is updated to the first 128 bits in the register 1712 and the word processing circuitry 2520 generates the intermediate calculation result $W_{tmp}$ of one word according to the last word $W_{2,3}$. The $4^{th}$ to the $7^{th}$ double words (i.e. the words $W_{3,0}$ to $W_{3,3}$) are the calculation results by the following formulae:

$$DW_4 = W_{tmp} \oplus W_{1,0}$$

$$DW_5 = W_{tmp} \oplus W_{1,0} \oplus W_{1,1}$$

$$DW_6 = W_{tmp} \oplus W_{1,0} \oplus W_{1,1} \oplus W_{1,2}$$

$$DW_7 = W_{tmp} \oplus W_{1,0} \oplus W_{1,1} \oplus W_{1,2} \oplus W_{1,3}$$

The AES key scheduling circuitry 2500 outputs the round key K #3 (including the words $W_{3,0}$ to $W_{3,3}$) to the AES data processing circuitry 810. The generations of the round key K #4 and the followings may be deduced by analogy and are omitted herein for brevity.

Figure 26:
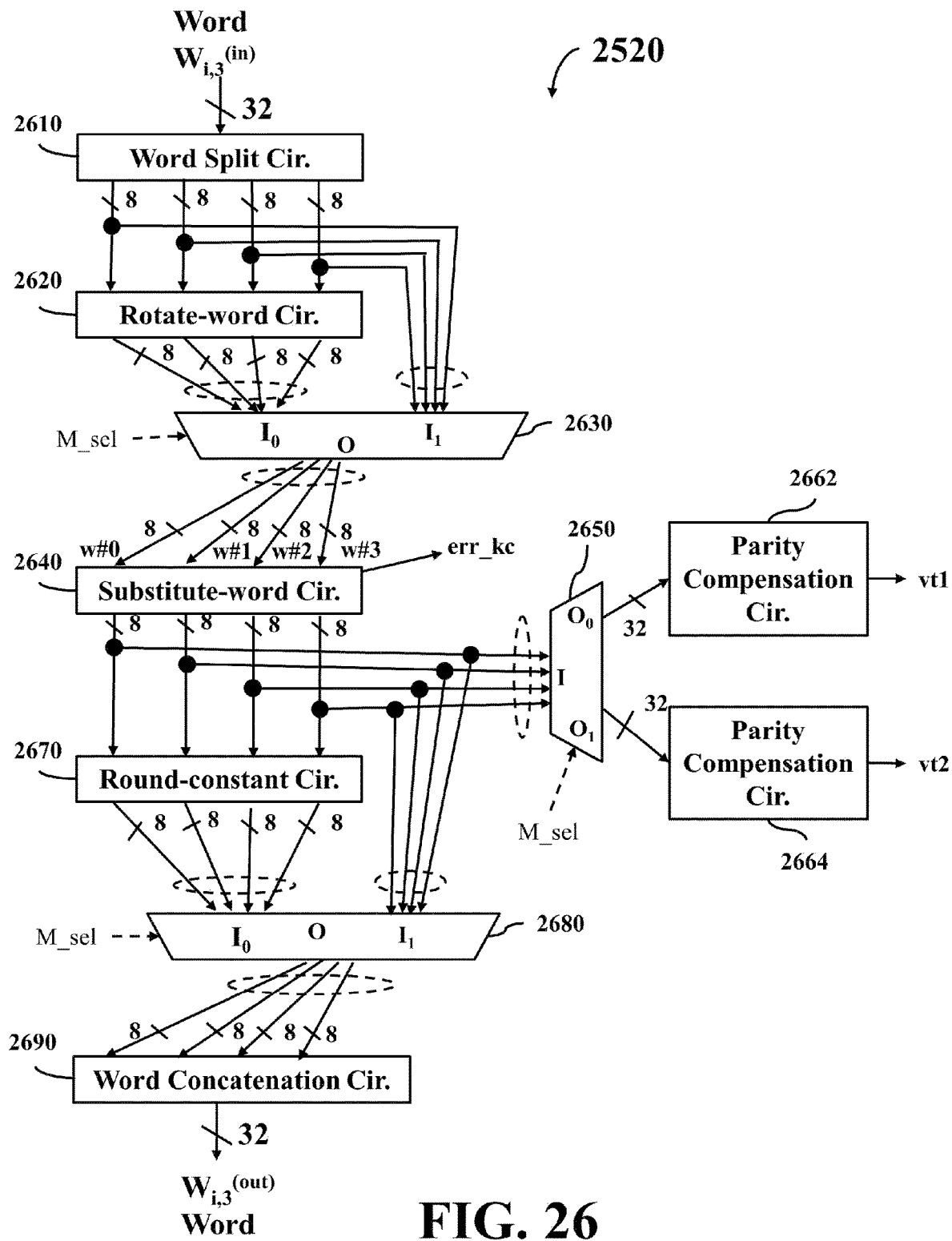
FIG. 26 is a block diagram of the dual-mode word-processing circuitry according to an embodiment of the invention.

Refer to FIG. 26 showing the block diagram of the word processing circuitry 2520. Starting from the $2^{nd}$ clock cycle, the word processing circuitry 2520 operates in two modes alternately: even-number round-key; and odd-number round-key. In the even-number round-key mode, the word processing circuitry 2520 generates the intermediate calculation result $W_{tmp}$ corresponding to the last word of the prior round key for one even-number round key (such as K #2, K #4, K #6, etc.) In the odd-number round-key mode, the word processing circuitry 2520 generates the intermediate calculation result $W_{tmp}$ corresponding to the last word of the prior round key for one odd-number round key (such as K #3, K #5, K #7, etc.)

The word split circuitry 2610 obtains the value of the $7^{th}$ double word (i.e. the last word) from the register 1712 and divides it into four subkeys, where each subkey is one byte. The structures, functionalities and operations of the rotate-word circuitry 2620, the substitute-word circuitry 2640, the round-constant circuitry 2670 and the word concatenation circuitry 2690 may refer to the relevant descriptions of the rotate-word circuitry 1820, the substitute-word circuitry 1830, the round-constant circuitry 1840 and the word concatenation circuitry 1850, and are omitted herein for brevity. The parity compensation circuitry 2662 includes the word-parity generation circuitry 1860, the word-parity prediction circuitry 1870, the word cross-parity prediction circuitry 1880 and the word-parity 9-bit concatenation circuitry 1890 shown in FIG. 18 for generating the across-word parity 9-bit $vt1_{0,8}$ and outputting it to the key-parity prediction circuitry 1772. The technical details of the parity compensation circuitry 2662 may refer to the descriptions of the corresponding circuitries shown in FIG. 18, and are omitted herein for brevity. The parity compensation circuitry 2664 includes the word-parity generation circuitry 2160, the word cross-parity prediction circuitry 2180 and the word-parity 9-bit concatenation circuitry 2190 shown in FIG. 21 for generating the across-word parity 9-bit $vt2_{0,8}$ and outputting it to the key-parity prediction circuitry 1774. The technical details of the parity compensation circuitry 2664 may refer to the descriptions of the corresponding circuitries shown in FIG. 21, and are omitted herein for brevity.

The word-processing circuitry 2520 further includes the multiplexer (MUX) 2630 and 2680, and the demultiplexer (DEMUX) 2650 to enable the controller 870 to arrange the data flows under the even-number round-key mode and the odd-number round-key mode. The input terminal $I_0$ of the MUX 2630 is coupled to the output of the rotate-word circuitry 2620, the input terminal $I_1$ of the MUX 2630 is coupled to the output of the word split circuitry 2610 and the output terminal O of the MUX 2630 is coupled to the input of the substitute-word circuitry 2640. The input terminal $I_0$ of the MUX 2680 is coupled to the output of the round-constant circuitry 2670, the input terminal $I_1$ of the MUX 2680 is coupled to the output of the substitute-word circuitry 2640 and the output terminal O of the MUX 2680 is coupled to the input of the word concatenation circuitry 2690. The input terminal I of the DEMUX 2650 is coupled to the output of the substitute-word circuitry 2640, the output terminal $O_0$ of the DEMUX 2650 is coupled to the input of parity compensation circuitry 2662 and the output terminal $O_1$ of the DEMUX 2650 is coupled to the input of parity compensation circuitry 2664. When the word-processing circuitry 2520 is activated, the controller 870 may issue the mode selection signal M_sel with the even-number round-key mode to the MUX 2630 to connect the input terminal $I_0$ of the MUX 2630 to the output terminal O of the MUX 2630, and issue the mode selection signal M_sel with the even-number round-key mode to the MUX 2680 to connect the input terminal $I_0$ of the MUX 2680 to the output terminal O of the MUX 2680 in each even-number clock cycle starting from the $2^{nd}$ clock cycle, so that the word $W_{i,3}^{(in)}$ is processed through the word split circuitry 2610, he rotate-word circuitry 2620, the substitute-word circuitry 2640, the round-constant circuitry 2670 and the word concatenation circuitry 2690 in sequence to generate the intermediate calculation result $W_{tmp}$, where i is an odd number equaling to or greater than 1. Additionally, the controller 870 may issue the mode selection signal M_sel with the even-number round-key mode to the DEMUX 2680 to connect the input terminal I to the output terminal $O_0$ of the DEMUX 2680 in each even-number clock cycle starting from the $2^{nd}$ clock cycle, so that the calculation result by the substitute-word circuitry 2640 is output to the parity compensation circuitry 2662 for generating the across-word parity 9-bit $vt1_{0..8}$. When the word-processing circuitry 2520 is activated, the controller 870 may issue the mode selection signal M_sel with the odd-number round-key mode to the MUX 2630 to connect the input terminal $I_1$ of the MUX 2630 to the output terminal O of the MUX 2630, and issue the mode selection signal M_sel with the odd-number round-key mode to the MUX 2680 to connect the input terminal $I_1$ of the MUX 2680 to the output terminal O of the MUX 2680 in each odd-number clock cycle starting from the $3^{rd}$ clock cycle, so that the word $W_{i,3}^{(in)}$ is processed through the word split circuitry 2610, the substitute-word circuitry 2640, and the word concatenation circuitry 2690 in sequence to generate the intermediate calculation result $W_{tmp}$, where i is an even number equaling to or greater than 2. Additionally, the controller 870 may issue the mode selection signal M_sel with the odd-number round-key mode to the DEMUX 2680 to connect the input terminal I to the output terminal $O_1$ of the DEMUX 2680 in each odd-number clock cycle starting from the $3^{rd}$ clock cycle, so that the calculation result by the substitute-word circuitry 2640 is output to the parity compensation circuitry 2664 for generating the across-word parity 9-bit $vt2_{0..8}$.

Although the embodiment has been described as having specific elements in FIGS. 1-2, 5, and 8-26, it should be noted that additional elements may be included to achieve better performance without departing from the spirit of the invention. Each element of FIGS. 1-2, 5, and 8-26 is composed of various circuits and arranged to operably perform the aforementioned operations.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for expanding round keys during data encryption, comprising:
   a register, comprising components arranged operably to store eight double words, wherein outputs of components for storing a $4^{th}$ double word to a $7^{th}$ double word are coupled to inputs of components for storing a $0^{th}$ double word to a $3^{rd}$ double words, respectively; and
   a word-processing circuitry, coupled to an output of a component for storing a last double word in the register, arranged operably to: operate in a first mode and a second mode alternately; in the first mode, calculate a first intermediate calculation result corresponding to an even-number round key according to the last double word; and in the second mode, calculate a second intermediate calculation result corresponding to an odd-number round key according to the last double word;
   first XOR gates, coupled to an output of a component for storing the $0^{th}$ double word in the register and the output of the word-processing circuitry, arranged operably to: perform a first bitwise XOR operation on the $0^{th}$ double word and the output of the word-processing circuitry; and output a first calculation result to the component for storing the $4^{th}$ double word in the register;
   second XOR gates, coupled to an output of a component for storing the $1^{st}$ double word in the register and an output of the first XOR gates, arranged operably to: perform a second bitwise XOR operation on the $1^{st}$ double word and the output of the first XOR gates; and output a second calculation result to the component for storing the $5^{th}$ double word in the register;
   third XOR gates, coupled to an output of a component for storing the $2^{nd}$ double word in the register and an output of the second XOR gates, arranged operably to: perform a third bitwise XOR operation on the $2^{nd}$ double word and the output of the second XOR gates; and output a third calculation result to the component for storing the $6^{th}$ double word in the register; and
   fourth XOR gates, coupled to an output of a component for storing the $3^{rd}$ double word in the register and an output of the third XOR gates, arranged operably to: perform a fourth bitwise XOR operation on the $3^{rd}$ double word and the output of the third XOR gates; and output a fourth calculation result to the component for storing the $7^{th}$ double word in the register.

2. The apparatus of claim 1, wherein the $0^{th}$ double word to the $3^{rd}$ double word form a first round key, the $4^{th}$ double word to the $7^{th}$ double word form a second round key, the first round key is 128 bits and the second round key is 128 bits.

3. The apparatus of claim 1, wherein the first to the fourth calculation results are expressed by the following formulae:

$$DW_4 = W_{tmp} \oplus W_{0,0}$$
$$DW_5 = W_{tmp} \oplus W_{0,0} \oplus W_{0,1}$$
$$DW_6 = W_{tmp} \oplus W_{0,0} \oplus W_{0,1} \oplus W_{0,2}$$
$$DW_7 = W_{tmp} \oplus W_{0,0} \oplus W_{0,1} \oplus W_{0,2} \oplus W_{0,3}$$

wherein $DW_4$ represents the first calculation result, $DW_5$ represents the second calculation result, $DW_6$ represents the third calculation result, $DW_7$ represents the fourth calculation result, Wtmp represents an intermediate calculation result outputted from the word-processing circuitry, $W_{i,0}$ represents the $0^{th}$ word of an $i^{th}$ round key, $W_{i,1}$ represents the $1^{st}$ word of the $i^{th}$ round key, $W_{i,2}$ represents the $2^{nd}$ word of the $i^{th}$ round key, $W_{i,3}$ represents the $3^{rd}$ word of the $i^{th}$ round key, i is an integer ranging from 1 to 12.

4. The apparatus of claim 1, wherein the word-processing circuitry comprises:
   a word split circuitry, coupled to the output of the component for storing the last double word, arranged operably to divide the last double word into four first bytes;
   a rotate-word circuitry, coupled to an output of the word split circuitry, arranged operably to circular left shift the four first bytes received from the word split circuitry by one byte to become four second bytes;
   a first multiplexer (MUX), comprising a first input terminal, a second input terminal and a first output terminal, wherein the first input terminal is coupled to an output of the rotate-word circuitry and the second input terminal is coupled to an output of the word split circuitry;

a substitute-word circuitry, coupled to first output terminal of the first MUX, arranged operably to convert each of the four first bytes or the four second bytes received from the first output terminal of the first MUX into a third byte according to a lookup table;

a round-constant circuitry, coupled to an output of the substitute-word circuitry, arranged operably to perform a bitwise XOR operation on each third byte and a constant to generate a fourth byte;

a second MUX, comprising a third input terminal, a fourth input terminal and a second output terminal, wherein the third input terminal is coupled to an output of the round-constant circuitry and the fourth input terminal is coupled to the output of the substitute-word circuitry; and a word concatenation circuitry, coupled to the second output terminal of the second MUX, arranged operably to combine the four fourth bytes received from the second terminal of the second MUX to generate the first intermediate calculation result; or combine the four third bytes received from the second terminal of the second MUX to generate the second intermediate calculation result.

5. The apparatus of claim 4, comprising:

a controller, coupled to the first MUX and the second MUX, arranged operably to: issue a first mode selection signal to the first MUX to connect the first input terminal to the first output terminal, and issue the first mode selection signal to the second MUX to connect the third input terminal to the second output terminal in each even-number clock cycle starting from a $2^{nd}$ clock cycle; and issue a second mode selection signal to the second MUX to connect the second input terminal to the first output terminal, and issue the second mode selection signal to the second MUX to connect the fourth input terminal to the second output terminal in each odd-number clock cycle starting from a $3^{rd}$ clock cycle.

6. The apparatus of claim 4, wherein the word-processing circuitry comprises:

a demultiplexer (DEMUX), comprising a fifth input terminal, a third output terminal and a fourth output terminal, wherein the fifth input terminal is coupled to the output of the substitute-word circuitry;

a first parity compensation circuitry, coupled to the third output terminal, arranged operably to generate a first across-word parity 9-bit corresponding to the odd-number round key according to the four third bytes; and a second parity compensation circuitry, coupled to the fourth output terminal, arranged operably to generate a second across-word parity 9-bit corresponding to the even-number round key according to the four third bytes.

7. The apparatus of claim 6, comprising:

a controller, coupled to the DEMUX, arranged operably to: issue a first mode selection signal to the DEMUX to connect the fifth input terminal to the third output terminal in each even-number clock cycle starting from a $2^{nd}$ clock cycle; and issue a second mode selection signal to the DEMUX to connect the fifth input terminal to the fourth output terminal in each odd-number clock cycle starting from a $3^{rd}$ clock cycle.

8. The apparatus of claim 4, wherein the substitute-word circuitry comprises four enhanced search circuitry and each enhanced search circuitry comprises:

a search circuitry, arranged operably to convert the first value of any of the four first bytes and the four second bytes into the second value of a K-bit according to an 8-to-K lookup table, wherein K is an integer ranging from 10 to 15 and the second value comprises (K minus 8) bits of a Hamming parity; and a substitution check circuitry, coupled to the search circuitry, arranged operably to employ check formulae corresponding to the 8-to-K lookup table to determine whether an error is occurred during a conversion of the first value of the one byte into the second value of the K-bit, and output an error signal when finding the error, wherein a total amount of the formulae is K minus 8.

9. The apparatus of claim 8, wherein most-significant 8 bits of each cell in the 8-to-K lookup table is established by a formula as follows:

$$SB_i = \text{Affine}\left((i)^{-1}\right)$$

$SB_i$ represents an output result of a value i, Affine( ) represents an Affine transformation function, and i is an integer ranging from 0 to 127.

10. The apparatus of claim 8, wherein K is 14.

11. The apparatus of claim 10, wherein the substitution check circuitry is arranged operably to use following 6 check formulae to analyze 6 bits of the Hamming parity according to a most-significant byte of the second value:

$$Hm_5 == S_7'^{(out)} + S_6'^{(out)} + S_5'^{(out)} + S_4'^{(out)} + S_3'^{(out)} + S_2'^{(out)} + S_1'^{(out)} + S_0'^{(out)}$$
$$Hm_4 == S_7'^{(out)} + S_4'^{(out)} + S_0'^{(out)}$$
$$Hm_3 == S_6'^{(out)} + S_5'^{(out)} + S_1'^{(out)} + S_0'^{(out)}$$
$$Hm_2 == S_4'^{(out)} + S_2'^{(out)} + S_1'^{(out)}$$
$$Hm_1 == S_5'^{(out)} + S_3'^{(out)} + S_2'^{(out)}$$
$$Hm_0 == S_7'^{(out)} + S_6'^{(out)} + S_3'^{(out)}$$

$Hm_5$ to $Hm_0$ represent a $5^{th}$ bit to a 0 bit of the Hamming parity, respectively, and $S'^{(out)}_7$ to $S'^{(out)}_0$ represent a $7^{th}$ bit to a $0^{th}$ bit of the most-significant byte of the second value, respectively, and wherein the substitution check circuitry is arranged operably to output the error signal when any one or more of the 6 check formulae are invalid.

12. The apparatus of claim 10, wherein the substitution check circuitry is arranged operably to use following 6 check formulae to analyze 6 bits of the Hamming parity according to a most-significant byte of the second value:

$$Hm_5 == S_7'^{(out)} + S_6'^{(out)} + S_5'^{(out)} + S_4'^{(out)} + S_3'^{(out)} + S_2'^{(out)} + S_1'^{(out)} + S_0'^{(out)}$$
$$Hm_4 == S_7'^{(out)} + S_4'^{(out)} + S_0'^{(out)}$$
$$Hm_3 == S_5'^{(out)} + S_2'^{(out)} + S_1'^{(out)} + S_0'^{(out)}$$
$$Hm_2 == S_6'^{(out)} + S_4'^{(out)} + S_1'^{(out)}$$

-continued $$Hm_1 == S_6'^{(out)} + S_5'^{(out)} + S_3'^{(out)}$$

$$Hm_0 == S_7'^{(out)} + S_3'^{(out)} + S_2'^{(out)}$$

$Hm_5$ to $Hm_0$ represent a $5^{th}$ bit to a $0^{th}$ bit of the Hamming parity, respectively, and $S'^{(out)}_7$ to $S'^{(out)}_0$ represent a $7^{th}$ bit to a $0^{th}$ bit of the most-significant byte of the second value, respectively, and wherein the substitution check circuitry is arranged operably to output the error signal when any one or more of the 6 check formulae are invalid.

13. The apparatus of claim 4, wherein the substitute-word circuitry comprises four enhanced search circuitry and each enhanced search circuitry comprises:

a search circuitry, arranged operably to convert the first value of any of the first bytes and the second bytes into the second value according to a lookup table; and a substitution check circuitry, coupled to the search circuitry, arranged operably to employ check formulae corresponding to the lookup table to determine whether an error is occurred during a conversion of the first value into the second value, and output the error signal when finding the error.

14. The apparatus of claim 13, wherein the lookup table is established by a formula as follows:

$$SB_i = \text{Affine}\left((i)^{-1}\right)$$

$SB_i$ represents an output result of a value i, Affine( ) represents the Affine transformation function, and i is an integer ranging from 0 to 127.

15. The apparatus of claim 14, wherein the substitution check circuitry comprises:

a computation circuitry, coupled to the search circuitry, arranged operably to obtain the second value, and calculate $\text{Affine}(S'^{(out)})^{-1}$ to generate a third value, wherein $S'^{(out)}$ represents the second value, $\text{Affine}(\ )^{-1}$ represents an inverse function of Affine transformation;

a multiplier, coupled to the search circuitry and the computation circuitry, arranged operably to multiply the second value by the third value to generate a fourth value; and a comparator, coupled to the search circuitry and the multiplier, arranged operably to generate a judgment result by implementing logic operations as follows:

$$\text{err\_nl} = 0, \text{ if } \left(S'^{(mul)} == 1\right) \&\& \left(S'^{(in)} != 0\right) \&\& \left(\text{Affine}(S'^{(out)})^{-1} != 0\right)$$

$$\text{err\_nl} = 0, \text{ if } \left(S'^{(mul)} == 0\right) \&\& \left(S'^{(in)} == 0\right) \&\& \left(\text{Affine}(S'^{(out)})^{-1} == 0\right)$$

$$\text{err\_nl} = 1, \text{ otherwise}$$

$S'^{(mul)}$ represents the fourth value, $S'^{(in)}$ represents the first value, $S'^{(out)}$ represents the second value, wherein the error is occurred when err_nl=1.

16. A method for expanding round keys during data encryption, performed by a controller, comprising:

configuring a word-processing circuitry to operate in a first mode to calculate a first intermediate calculation result corresponding to an even-number round key according to a last double word of a $0^{th}$ double word to a $7^{th}$ double word in each even-number clock cycle starting from a $2^{nd}$ clock cycle, wherein, in the first mode, a first data path is formed in the word-processing circuitry, which comprises a word split circuitry, a rotate-word circuitry, a substitute-word circuitry, a round-constant circuitry and a word concatenation circuitry; and configuring the word-processing circuitry to operate in a second mode to calculate a second intermediate calculation result corresponding to an odd-number round key according to the last double word of the $0^{th}$ double word to the $7^{th}$ double word in each odd-number clock cycle starting from a $3^{rd}$ clock cycle, wherein, in the second mode, a second data path is formed in the word-processing circuitry, which comprises the word split circuitry, the substitute-word circuitry and the word concatenation circuitry.

17. The method of claim 16, wherein the $0^{th}$ double word to the $3^{rd}$ double word form a first round key, the $4^{th}$ double word to the $7^{th}$ double word form a second round key, the first round key is 128 bits and the second round key is 128 bits.

18. The method of claim 16, wherein the word-processing circuitry comprising:

the word split circuitry, arranged operably to divide the last double word into four first bytes;

the rotate-word circuitry, coupled to an output of the word split circuitry, arranged operably to circular left shift the four first bytes received from the word split circuitry by one byte to become four second bytes;

a first multiplexer (MUX), comprising a first input terminal, a second input terminal and a first output terminal, wherein the first input terminal is coupled to an output of the rotate-word circuitry and the second input terminal is coupled to an output of the word split circuitry;

the substitute-word circuitry, coupled to first output terminal of the first MUX, arranged operably to convert each of the four first bytes or the four second bytes received from the first output terminal of the first MUX into a third byte according to a lookup table;

the round-constant circuitry, coupled to an output of the substitute-word circuitry, arranged operably to perform a bitwise XOR operation on each third byte and a constant to generate a fourth byte;

a second MUX, comprising a third input terminal, a fourth input terminal and a second output terminal, wherein the third input terminal is coupled to an output of the round-constant circuitry and the fourth input terminal is coupled to the output of the substitute-word circuitry; and the word concatenation circuitry, coupled to the second output terminal of the second MUX, arranged operably to combine the four fourth bytes received from the second terminal of the second MUX to generate the first intermediate calculation result; or combine the four third bytes received from the second terminal of the second MUX to generate the second intermediate calculation result.

19. The method of claim 16, the method comprising:

issuing a first mode selection signal to the first MUX to connect the first input terminal to the first output terminal, and issuing the first mode selection signal to the second MUX to connect the third input terminal to the second output terminal to form the first data path in the word-processing circuitry in each even-number clock cycle starting from the $2^{nd}$ clock cycle; and issuing a second mode selection signal to the second MUX to connect the second input terminal to the first output terminal, and issuing the second mode selection signal to the second MUX to connect the fourth input terminal to the second output terminal to form the second data path in the word-processing circuitry in each odd-number clock cycle starting from the $3^{rd}$ clock cycle.

20. The method of claim 16, wherein the first intermediate calculation result is used to generate the even-number round key and the second intermediate calculation result is used to generate the odd-number round key.

* * * * *